US012604505B2

(12) United States Patent
Hsieh et al.

(10) Patent No.: US 12,604,505 B2
(45) Date of Patent: Apr. 14, 2026

(54) SiC TRENCH MOSFET WITH AN EMBEDDED JUNCTION BARRIER SCHOTTKY DIODE

(71) Applicant: Nami MOS CO., LTD., New Taipei City (TW)

(72) Inventors: Fu-Yuan Hsieh, New Taipei City (TW); Lin Xu, Shanghai (CN)

(73) Assignee: NAMI MOS CO., LTD., New Taipei City (TW)

( * ) Notice: Subject to any disclaimer, the term of this patent is extended or adjusted under 35 U.S.C. 154(b) by 429 days.

(21) Appl. No.: 18/383,191

(22) Filed: Oct. 24, 2023

(65) Prior Publication Data

US 2025/0133796 A1    Apr. 24, 2025

(51) Int. Cl.
| | |
|---|---|
| *H10D 62/832* | (2025.01) |
| *H10D 8/60* | (2025.01) |
| *H10D 30/66* | (2025.01) |
| *H10D 62/10* | (2025.01) |

(52) U.S. Cl.
CPC ......... *H10D 62/8325* (2025.01); *H10D 8/605* (2025.01); *H10D 30/668* (2025.01); *H10D 62/127* (2025.01)

(58) Field of Classification Search
CPC ............. H10D 62/127; H10D 62/8325; H10D 30/668; H10D 8/605; H10D 8/60; H10D 12/031; H10D 62/106; H10D 62/157; H10D 62/393; H10D 64/117; H10D 64/256; H10D 62/107; H10D 84/146
USPC .......................................................... 257/77
See application file for complete search history.

(56) References Cited

U.S. PATENT DOCUMENTS

| | | | |
|---|---|---|---|
| 2022/0123140 A1* | 4/2022 | Hsieh | ................... H10D 30/668 |
| 2022/0190117 A1 | 6/2022 | Hung et al. | |

* cited by examiner

*Primary Examiner* — Monica D Harrison
(74) *Attorney, Agent, or Firm* — BACON & THOMAS, PLLC

(57) ABSTRACT

A SiC trench MOSFET with an embedded junction Schottky barrier diode (JBSD) having P-shield (PS) regions surrounding bottoms of source-body-Schottky contact (SBSC) trenches for gate oxide electric-field and switching loss reductions is disclosed. A source metal connects with the PS regions and the JBSD directly. Sidewall P (SP) regions are formed along a portion of sidewalls of the SBSC trenches to improve a tradeoff between a drain-source leakage current of the SiC trench MOSFET and a forward voltage of the JBSD. The device further comprises an N-type shield region formed below each of gate trenches for gate oxide electric field strength and specific on-resistance reductions.

20 Claims, 31 Drawing Sheets

A1-A1' Section

A1-A1' Section

A1-A1' Section

312'

321'

G
305'

306'

PS2

303'

310' n+ p+ p

S | Ncs

P 303.1'

327'

JBSD

PS1

318' n+ p+ n+ p+ n+ p p+

JBSD

A1-A1' Section n+ | p | p+
JBSD
PS 409
412
421
G
405
406
NS 415
403

411
n+ | p | p+
JBSD
PS n+
p+ | p
S
P

A1-A1' Section

Fig. 4B

A1-A1' Section n+ p+

Figure 5A:
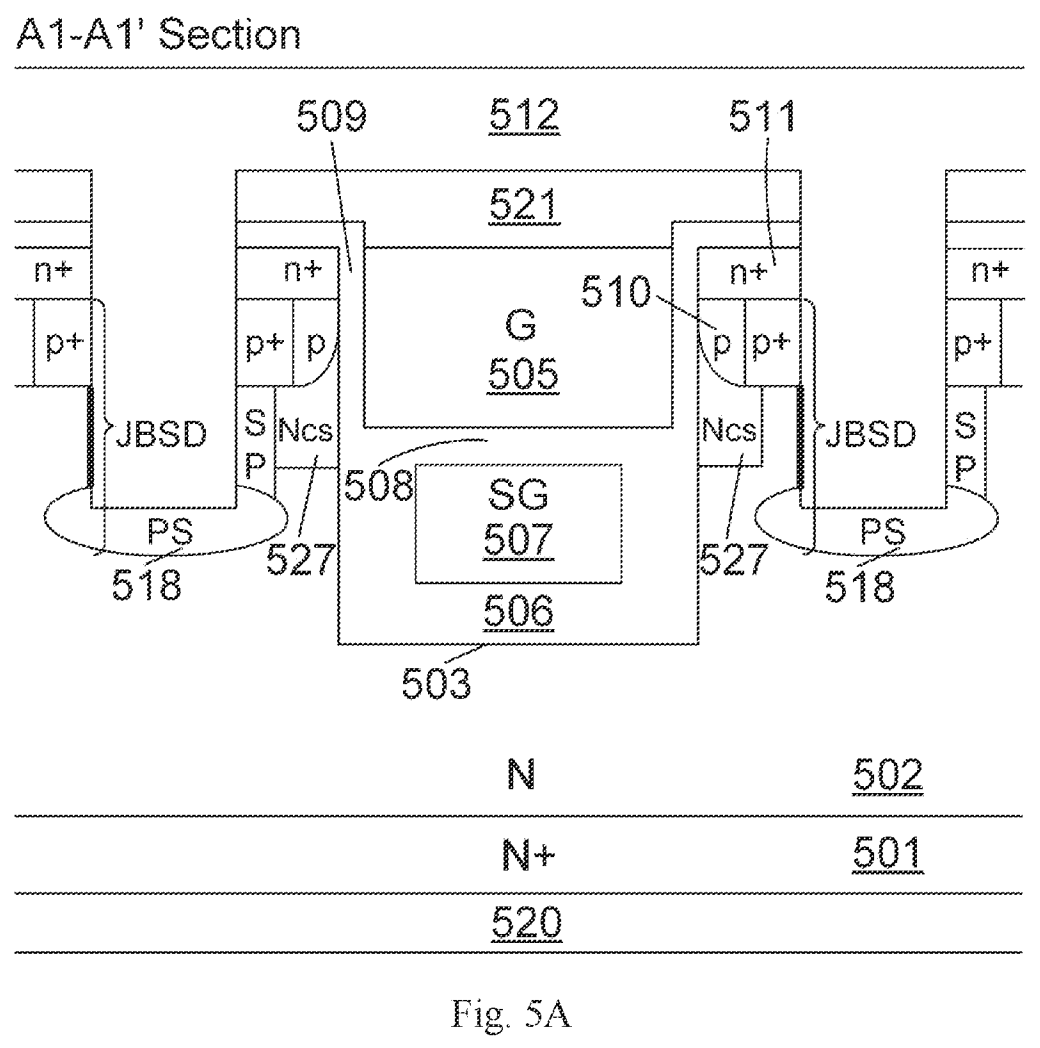

JBSD

PS
518

511 n+ p+  p

510

512  521

509

G
505

508

SG
507

506

503 n+ p+  p

S  Ncs

JBSD

PS
518

527

Ncs

A1-A1' Section

A1-A1' Section n+ p+

Figure 20:
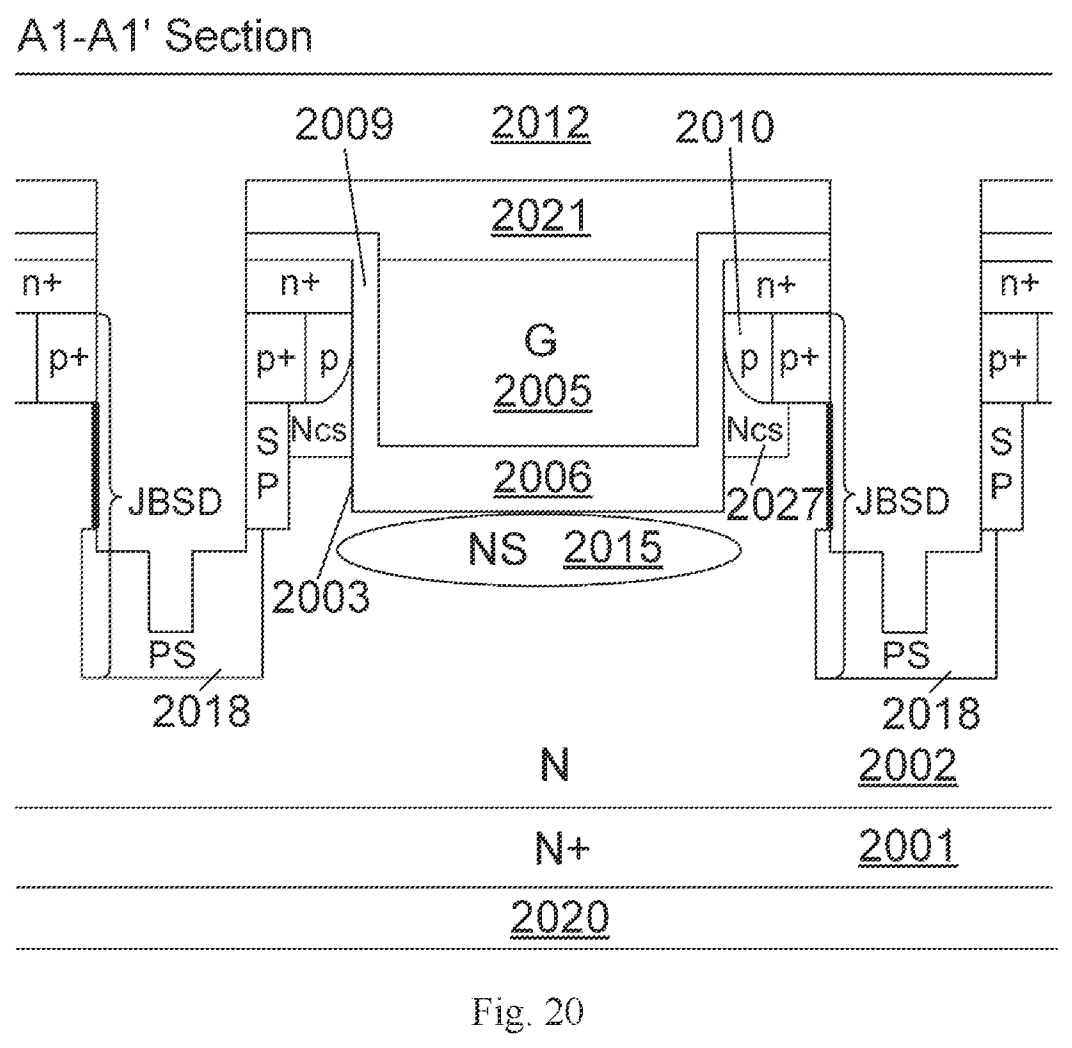

S

P

JBSD

PS

2018

2002

2001 n+ p | p+

Ncs

2027

2010

2012

2021

G
2005

2006

NS  2015

N

N+

2020

2009 n+ p+ | p

Ncs

S

P

2003

JBSD

SiC TRENCH MOSFET WITH AN EMBEDDED JUNCTION BARRIER SCHOTTKY DIODE

FIELD OF THE INVENTION

This invention relates generally to semiconductor devices, and more particularly, to a silicon carbide (SiC) trench Metal Oxide Semiconductor Field Effect Transistor (MOSFET) having an embedded junction barrier Schottky diode (JBSD) formed along sidewalls of a source-body-Schottky contact (SBSC) trench to inactivate parasitic body diodes for turn-off switching loss reduction without lowering the channel density. A sidewall P (SP) region is formed along the SBSC trench to adjust the JBSD area to improve a trade-off between the drain-source leakage current and the forward voltage of the JBSD. The device further comprises a current spreading region surrounding gate trenches below body regions, to achieve a lower specific on-resistance.

BACKGROUND OF THE INVENTION

Because of the physical properties of SiC, SiC-MOSFETs can achieve a higher breakdown voltage, lower on-resistance and higher switching speed than Si-MOSFETs. However, SiC-MOSFETs have a higher electric-field strength at the gate oxide than Si-MOSFETs because of a poor interface state between SiC and the gate oxide requiring higher gate-source voltage Vgs to fully turn on device channel. e.g., for Si device, Vgs=10V can fully turn on the Si device channel but for SiC requires Vgs=18V. The higher Vgs causes higher electric filed strength at gate oxide resulting in a reliability issue.

FIG. 1 shows a prior art (US 2022/0190117 A1) having a p+ shield region 52 below a trench gate region 60 for the gate oxide strength reduction and an embedded Schottky barrier diode (SBD) for the switching loss reduction. A metal film 81 is deposited into a source contact trench to form the SBD with an n type layer 20 along sidewalls and a bottom of the second trench. However, the SBD formed at a bottom of the second trench as shown in FIG. 1 would suffer from serious barrier lowering effect which will result in early breakdown of the device due to a high drain-source leakage current.

Therefore, there is still a need in the art of the SiC semiconductor device design and fabrication to provide a novel cell structure, device configuration and manufacturing process that would resolve this difficulty and design limitations, making SiC trench devices have lower electric-field strength at the gate oxide, achieve lower on-resistance and lower turn-off switching loss.

SUMMARY OF THE INVENTION

The present invention discloses a SiC trench MOSFET having an embedded Junction Barrier Schottky diode (JBSD) which has two P type-N type (PN) junction diodes and a Schottky barrier diode (SBD) formed along a source-body-Schottky contact (SBSC) trench. The device with the JBSD structure is a solution to solve the high leakage current issue occurring in a high voltage SiC-SBD device.

The SBSC trench is penetrating through a source region of a first conductivity type and a body region of a second conductivity type and extending into an epitaxial layer; a P-shield (PS) region of the second conductivity type for gate oxide electric-field reduction surrounds a bottom of the SBSC trench and being spaced apart from a gate trench; The SBSC trench has a trench depth deeper than that of the gate trench so that the PS region can effectively reduce the gate oxide electric field strength without requiring an additional PS region below the gate trench as the prior art shown in FIG. 1. A sidewall P (SP) region of the second conductivity type is formed selectively along a portion of sidewalls of the SBSC trench, connecting the PS region to a body contact region to improve a trade-off between a drain-source leakage current $I_{dsl}$ and a forward voltage $V_f$ of the JBSD by adjusting the overlapping area between the SP region and the SBSC trench; a body contact region of the second conductivity type is disposed in the body region for formation of an ohmic contact to a source metal; at least one conductive material as a source metal filling into the SBSC trench to form an ohmic contact with the source region and the body contact region, and form a Schottky contact with the epitaxial layer; the JBSD is formed between the source region and a bottom of the buried PS region comprising two PN junction diodes and one SBD; a first PN junction diode is formed between a body combination area (including the body region and the body contact region) and the epitaxial layer, and a second PN junction diode is formed between the PS region and the epitaxial layer; and the SBD is formed between the body contact region and the PS region by making a Schottky contact with the epitaxial layer.

According to one aspect, the invention features a SiC power device comprising a plurality of unit cells with each unit cell in an active area comprising: an epitaxial layer of a first conductivity type on a substrate; at least one gate trench surrounded by a source region of the first conductivity type encompassed in a body region of a second conductivity type on a top portion of the epitaxial layer; a gate electrode disposed in the gate trench surrounded with a first insulating film on a bottom of the gate trench, and with a gate oxide on sidewalls of the gate trench; a N-shield (NS) region of the first conductivity type for gate oxide protection disposed directly below the gate electrode; the first insulating film having a thickness greater than the second insulating film; The SP region is formed along a first sidewall of the SBSC trench and the SBD is formed along a second sidewall of the SBSC trench opposite to the first sidewall.

According to another aspect, the SP and SBD regions are alternately formed along two sidewalls of the SBSC trench.

According to another aspect, in some preferred embodiments, the substrate has the first conductivity type and the epitaxial layer comprises a single epitaxial layer having a uniform doping concentration.

According to another aspect, in some preferred embodiments, the substrate has the first conductivity type and the epitaxial layer has multiple stepped epitaxial (MSE) layers with different doping concentrations decreasing stepwise in a direction from the substrate to a top surface of the epitaxial layer, wherein each of the MSE layers has a uniform doping concentration as grown.

According to another aspect, in some preferred embodiments, the substrate has the second conductivity type and the epitaxial layer compromises a single epitaxial layer having a uniform doping concentration with a resistivity R, and the SiC power device further comprises a buffer layer of the first conductivity type with a resistivity Rb sandwiched between the substrate and the epitaxial layer, wherein R>Rb.

According to another aspect, in some preferred embodiments, the substrate has the second conductivity type, further comprises a buffer layer of the first conductivity type formed sandwiched between the substrate and the epitaxial layer, and a plurality of heavily doped regions of the first conductivity type in the substrate to form a plurality of alternating Pt and N+ regions in the substrate.

According to another aspect, the present invention also features a SiC power device further comprising a current spreading region of the first conductivity type surrounding at least sidewalls of the gate trench in the active area, wherein the current spreading region has a higher doping concentration than the epitaxial layer.

According to another aspect the invention also features a SiC power device formed in an epitaxial layer of a first conductivity type on a substrate of the first conductivity type, further comprising: a plurality of gate trenches surrounded by source regions of the first conductivity type encompassed in body regions of a second conductivity type on a top portion of the epitaxial layer, each of the gate trenches being filled with a gate electrode and a shielded gate electrode, wherein the shielded gate electrode being insulated from the epitaxial layer by a first insulating film, the gate electrode being insulated from the epitaxial layer by a gate oxide, the shielded gate electrode and the gate electrode being insulated from each other by an inter-polysilicon oxide (IPO) film, the gate oxide being formed along sidewalls in the upper portion of the gate trenches and having a thickness less than the first insulating film. An NS region of the first conductivity type for gate oxide protection is disposed directly below the gate trench.

According to another aspect, in some preferred embodiments, within each of the gate trenches, the shielded gate electrode is disposed in a lower portion and the gate electrode is disposed in an upper portion. In some other preferred embodiments, within each of the gate trenches, the shielded gate electrode is disposed in the middle and the gate electrode is a pair of split gate electrodes disposed surrounding an upper portion of the shielded gate electrode, and a second insulating film formed during growing the gate oxide covering on an upper portion of the shielded gate electrode.

According to another aspect, the SBSC trench has a first type SBSC trench and a second type SBSC trench; the first type SBSC trench is formed above the second type SBSC trench and has a trench width wider than a trench width of the second type SBSC trench; the PS region surrounds sidewalls and a bottom of the second SBSC trench. Since a space between the second trench of the SBSC trench and its facing gate trench becomes larger, the on-resistance is reduced as a result of the less pinch-off effect between the second trench and the gate trench.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings:

FIG. 2D is a cross-sectional view showing another preferred A1-A1' cross section of FIG. 2A according to the present invention.

FIG. 3A is a cross-sectional view showing another preferred A1-A1' cross section of FIG. 2A according to the present invention.

FIG. 3B is a cross-sectional view showing another preferred A1-A1' cross section of FIG. 2A according to the present invention.

FIG. 4A is a cross-sectional view showing another preferred A1-A1' cross section of FIG. 2A according to the present invention.

FIG. 4B is a cross-sectional view showing another preferred A1-A1' cross section of FIG. 2A according to the present invention.

FIG. 5A is a cross-sectional view showing another preferred A1-A1' cross section of FIG. 2A according to the present invention.

FIG. 6 is a cross-sectional view showing another preferred A1-A1' cross section of FIG. 2A according to the present invention.

FIG. 7A is a cross-sectional view showing another preferred A1-A1' cross section of FIG. 2A according to the present invention, wherein the doping concentration variations of the N type epitaxial layer as grown are depicted along the vertical direction.

FIG. 17 is a cross-sectional view showing another preferred A1-A1' cross section of FIG. 2A according to the present invention.

FIG. 18 is a cross-sectional view showing another preferred A1-A1' cross section of FIG. 2A according to the present invention.

FIG. 19 is a cross-sectional view showing another preferred A1-A1' cross section of FIG. 2A according to the present invention.

FIG. 20 is a cross-sectional view showing another preferred A1-A1' cross section of FIG. 2A according to the present invention.

FIG. 22 is a cross-sectional view showing another preferred A1-A1' cross section of FIG. 2A according to the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom". "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
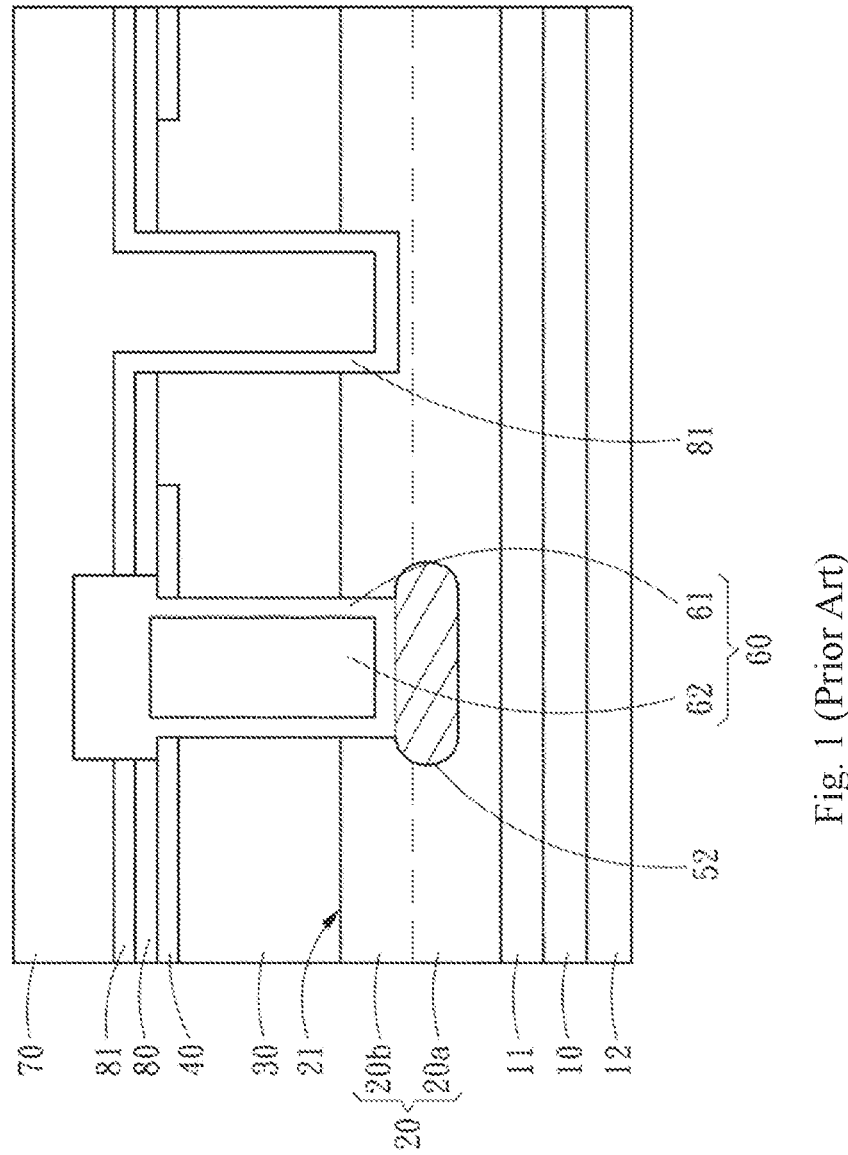
FIG. 1 is a cross-sectional view of a semiconductor device of a prior art (US 2022/0190117 A1).
Figure 1:
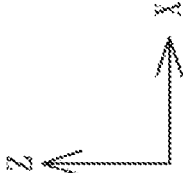
Figure 2A:
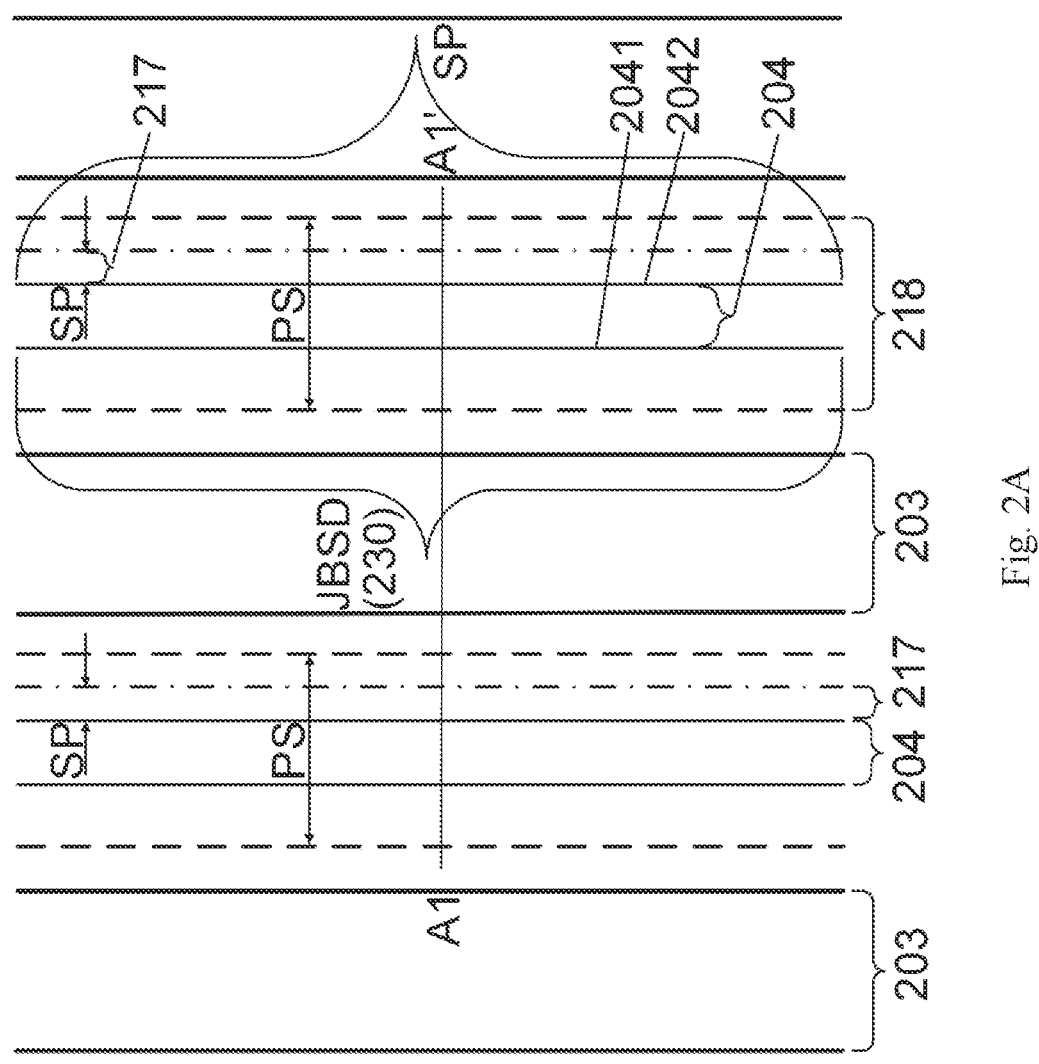
FIG. 2A is a top view of a preferred embodiment for a trench semiconductor power device with stripe cells layout according to the present invention.

Please refer to FIG. 2A for a top view of a SiC power device with stripe cells layout. A gate trench 203 is spaced apart from the source-body-Schottky contact (SBSC) trench 204, wherein the gate trench 203 has a stripe shape and the SBSC trench 204 is surrounded by a P-shield (PS) region 218. According to this invention, a junction barrier Schottky diode (JBSD) region 230 is formed along a first sidewall 2041 of the SBSC trench 204 and a sidewall P (SP) region 217 is formed along a second sidewall 2042 of the SBSC trench 204.

Figure 2B:
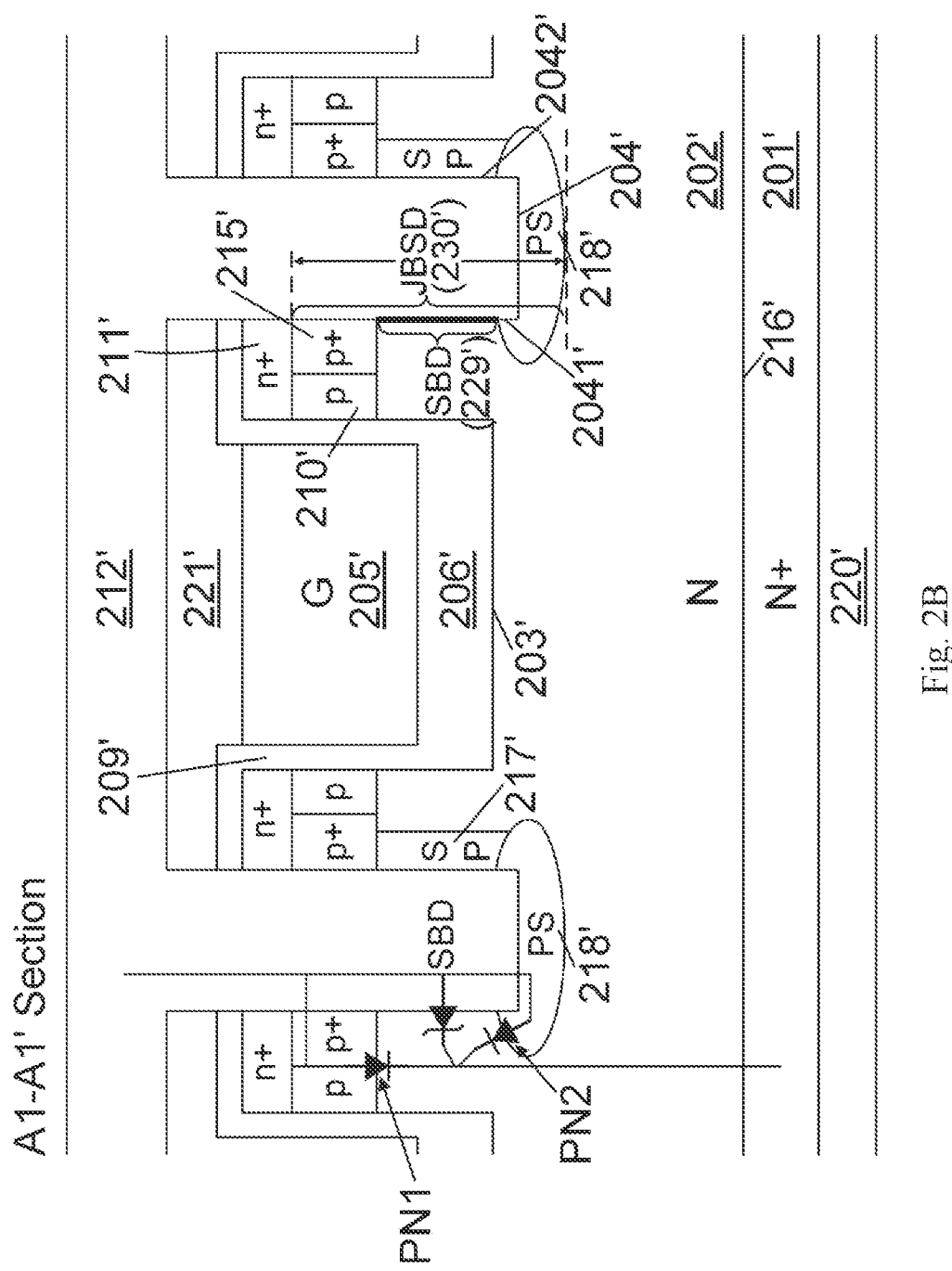
FIG. 2B is a cross-sectional view showing a preferred A1-A1' cross section of FIG. 2A according to the present invention.

Please refer to FIG. 2B for a preferred A1-A1' cross-sectional view of FIG. 2A. A SiC device comprising a trench MOSFET formed on an N+ type SiC substrate 201' with a less doped N type SiC epitaxial layer 202' extending thereon, wherein the N+ substrate 201' is coated with a back metal 220' of Ti/Ni/Ag on the rear side as a drain metal. Inside the N type epitaxial layer 202', a plurality of gate trenches 203' and SBSC trenches 204' are formed vertically downward from a top surface of the N type epitaxial layer 202' and not reaching the interface 216' between the N type epitaxial layer 202' and the N+ substrate 201', wherein the SBSC trench 204' has a trench depth deeper than that of the gate trench 203'. Inside each of the gate trenches 203', a gate electrode 205' (G, as illustrated) is disposed in an upper portion of the gate trenches 203' and surrounded with a thick bottom oxide as the first insulating film 206' on a bottom of the gate trenches 203', and with a gate oxide 209' on sidewalls of the gate trenches 203', wherein the gate oxide 209' has a less thickness than the first insulating film 206'. Between the gate trench 203' and the SBSC trench 204', a p body region 210' with $n^+$ source regions 211' thereon is extending at a top surface of the N type epitaxial layer 202' and surrounding the gate electrode 205' padded by the gate oxide 209', wherein a $p^+$ body contact region 215' is formed below the $n^+$ source regions 211' in the p body regions 210' to reduce the body contact resistance. A plurality of SBSC trenches 204' are formed penetrating through the $n^+$ source region 211' and the p body region 210', and a P-shield region 218' (PS, as illustrated) for gate oxide electric-field reduction is formed surrounding a bottom of the SBSC trench 204' and being spaced apart from the gate trenches 203'. An interlayer dielectric film 221' is stacked on the epitaxial layer 202', and a source metal 212' is formed onto the interlayer dielectric film 221' and filling into the SBSC trench 204' to contact with the $n^+$ source region 211', the $p^+$ body contact region 215' and the P-shield region 218', and form a Schottky barrier diode (SBD, as illustrated) region 229' by making a Schottky contact with the epitaxial layer 202' between the p body contact 215' and the buried P-shield regions 218' along a first sidewall 2041' of the SBSC trench 204'. According to this invention, a JBSD region 230' is formed between the $n^+$ source region 211' and a bottom of the P-shield region 218', comprising a first P type-N type (PN1, as illustrated) junction diode, a second P type-N type (PN2, as illustrated) junction diode and the SBD, wherein the PN1 junction diode is formed between a body combination area 213' of the $p^+$ body contact region 215' and the body region 210', and the N type epitaxial layer 202'; and the PN2 junction diode is formed between the PS region 218' and the N type epitaxial layer 202'. A sidewall P region 21T (SP, as illustrated) is formed along a second sidewall 2042' of the SBSC trench 204', vertically connecting the P-shield region 218' to the $p^+$ body contact region 215'.

Figure 2C:
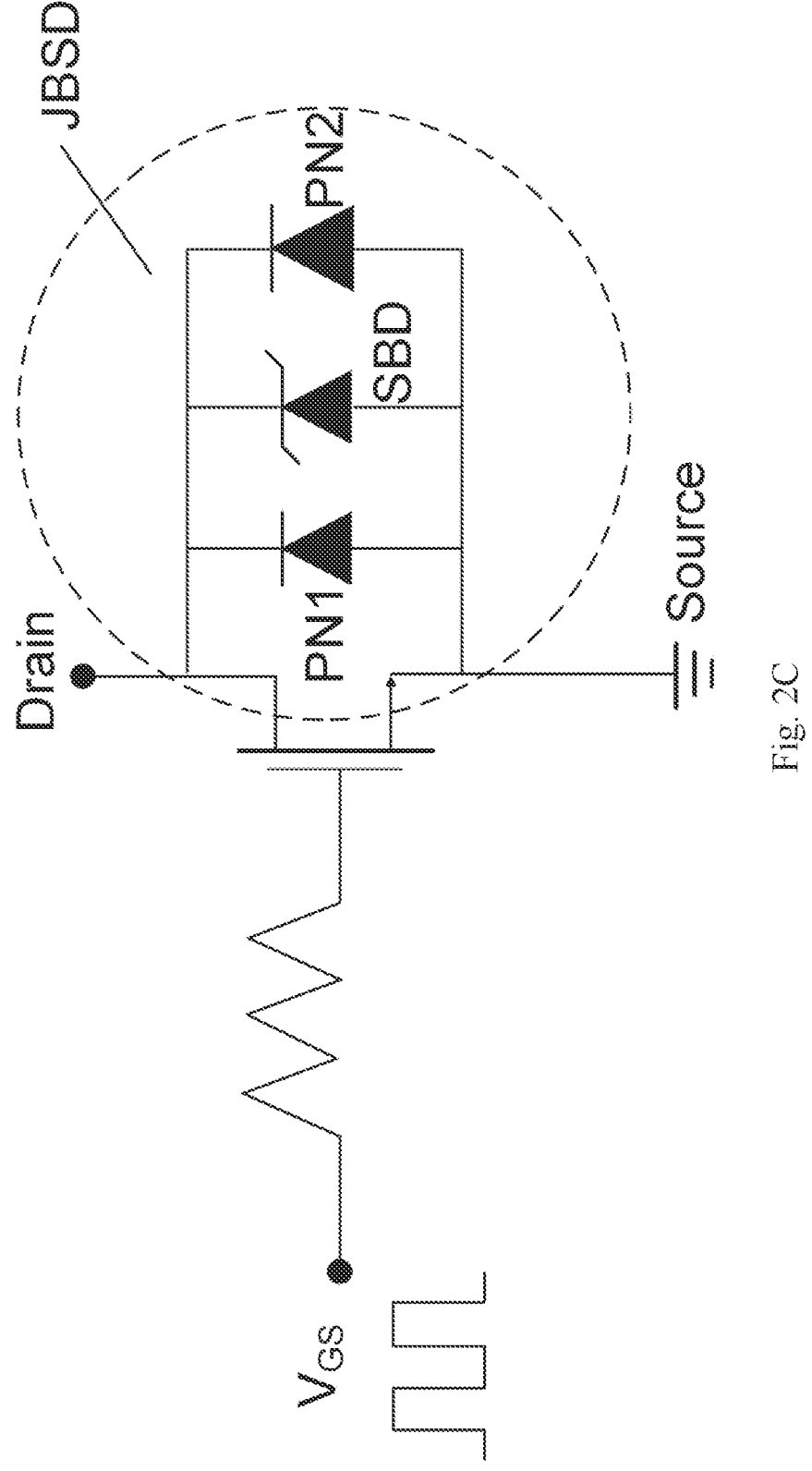
FIG. 2C is an equivalent circuit of the trench MOSFET with an embedded JBSD shown in FIG. 2B.

Please refer to FIG. 2C for an equivalent circuit of the trench MOSFET with an embedded JBSD shown in FIG. 2B, wherein the JBSD comprises a PN1, a PN2 and an SBD.

Figure 2D:
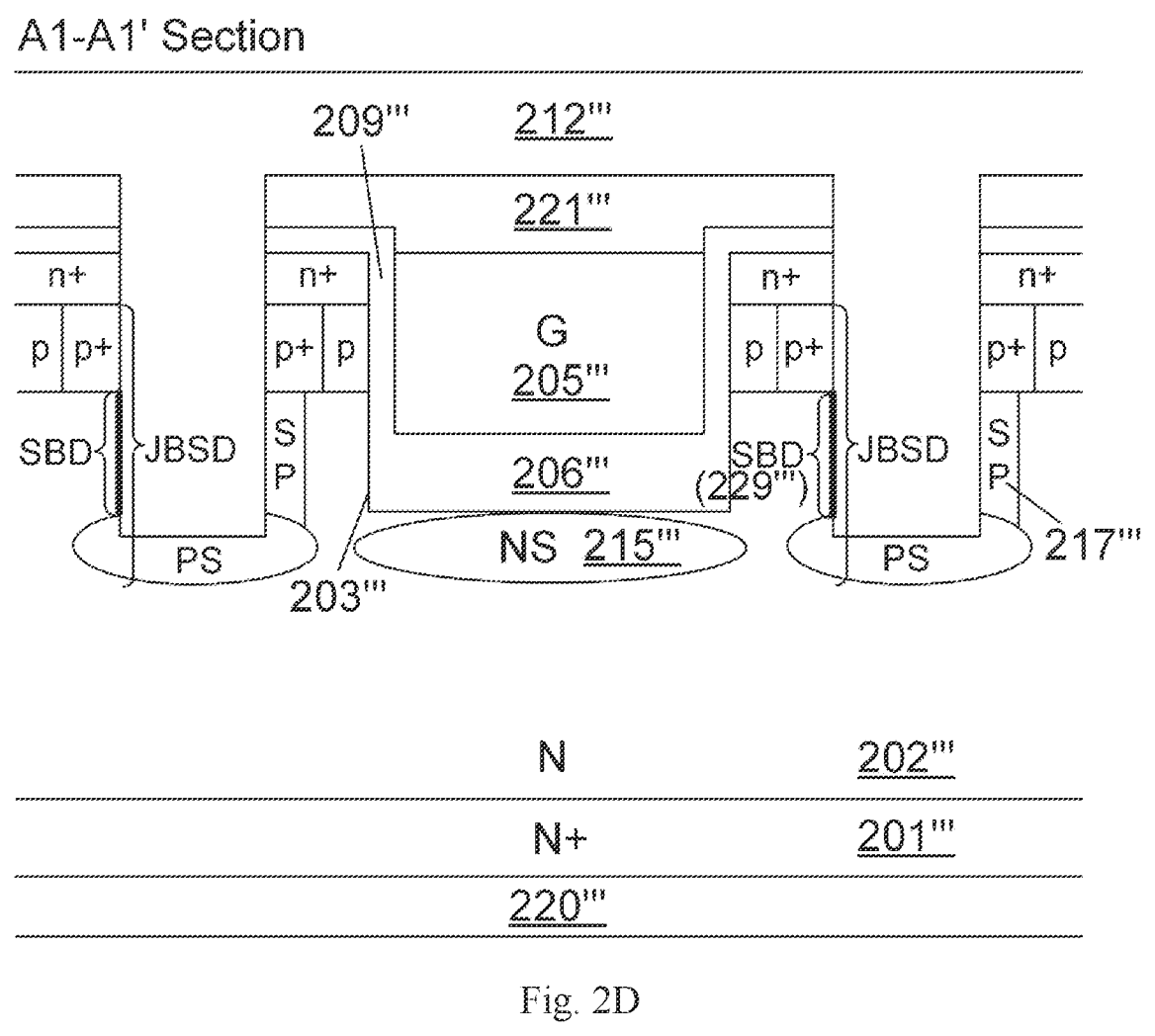

Please refer to FIG. 2D for another preferred A1-A1' cross-sectional view of FIG. 2A. The SiC power device has a similar structure to FIG. 2B, except that in the present invention, an N-shield region 215''' (NS, as illustrated) for gate oxide protection is disposed below the gate electrode 205''' (G, as illustrated) in the N type epitaxial layer 202''' with a doping concentration higher than that of the N type epitaxial layer 202'''.

Figure 3A:
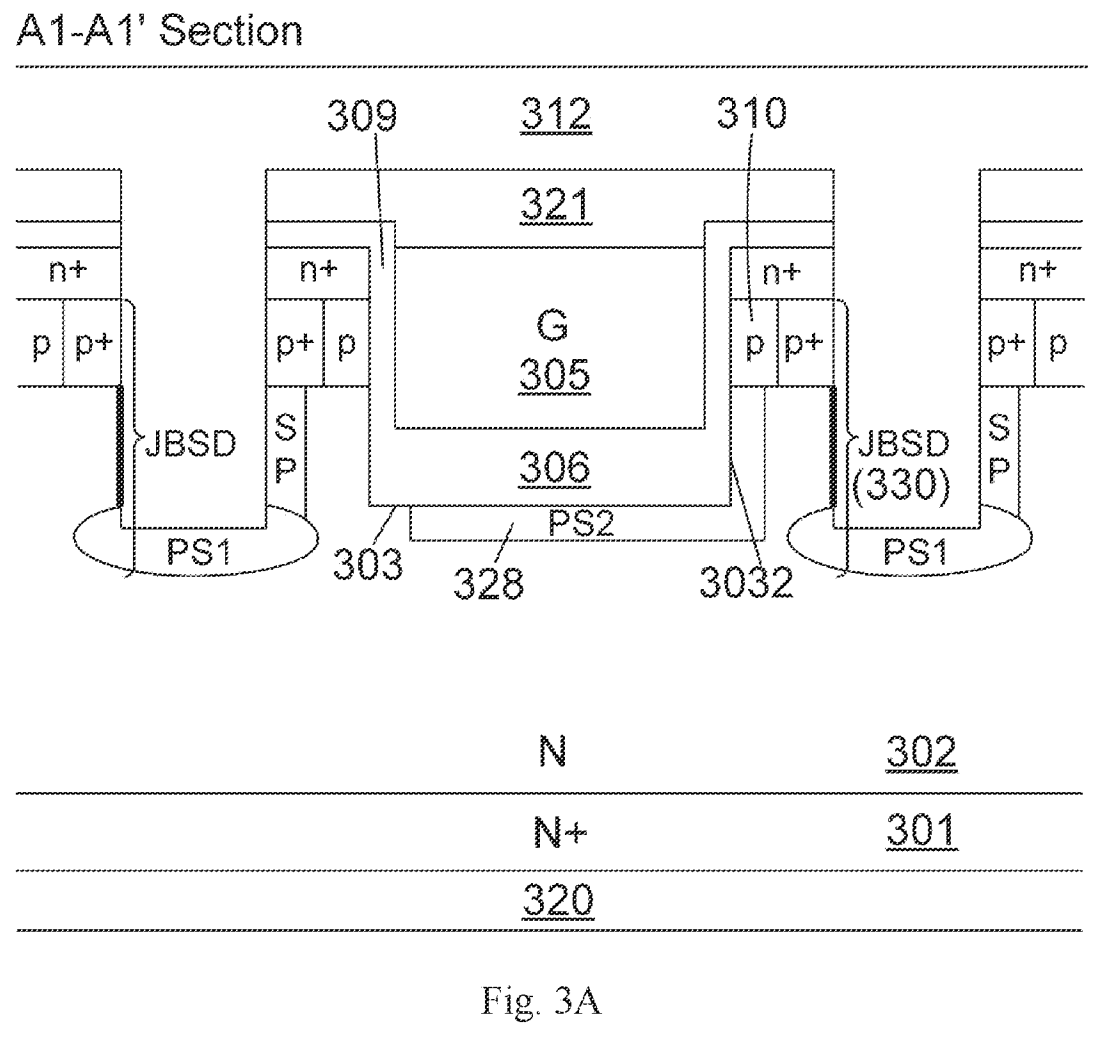

Please refer to FIG. 3A for another preferred A1-A1' cross-sectional view of FIG. 2A. The SiC power device has a similar structure to FIG. 2B, except that the present invention further comprises a second P-shield region 328 (PS2, as illustrated) surrounding a sidewall 3032 of the gate trench 303 on an opposite side of the JBSD region 330 and adjoining the p body region 310, and extending further along a portion of a bottom of the gate trench 303.

Figure 3B:
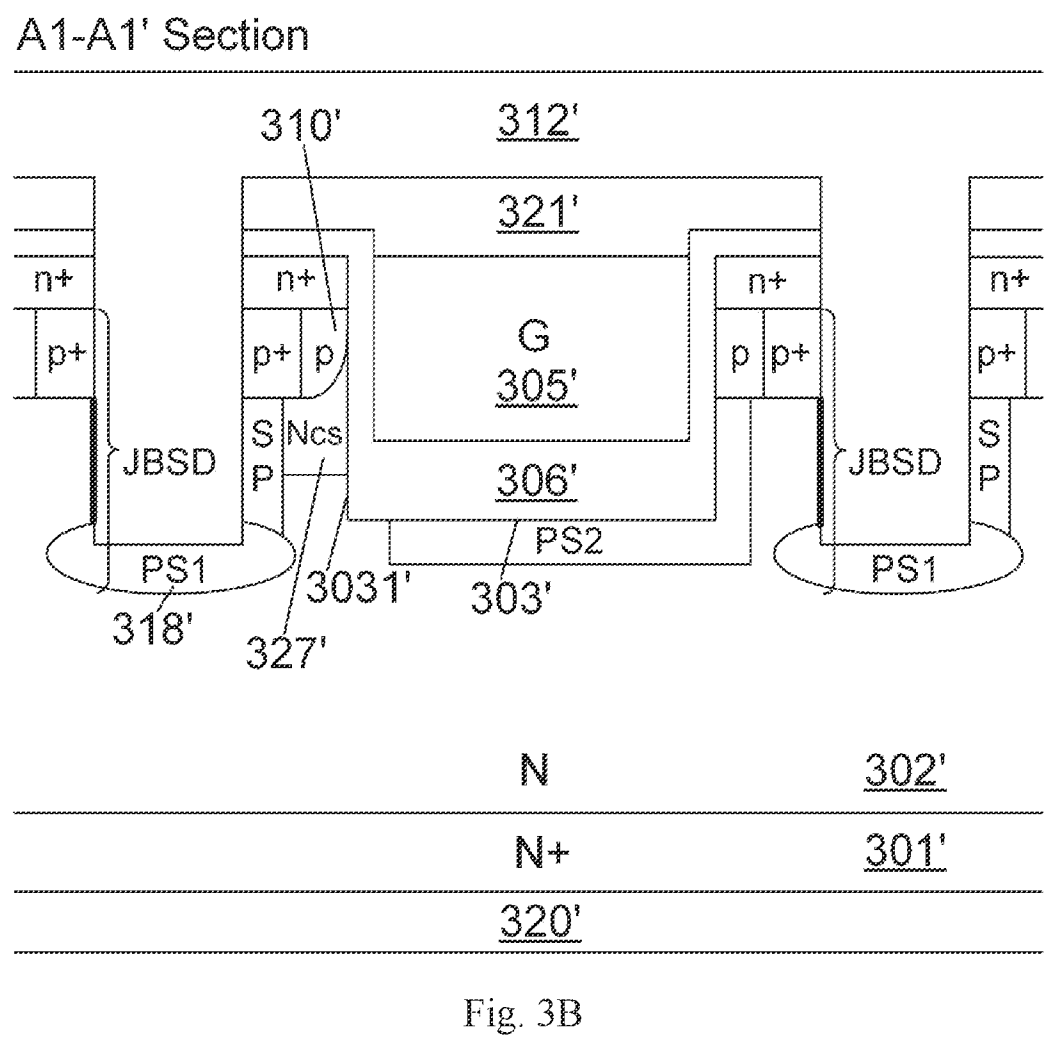

Please refer to FIG. 3B for another preferred A1-A1' cross-sectional view of FIG. 2A. The SiC power device has a similar structure to FIG. 3A, except that in the present structure, a current spreading layer 327' (Ncs, as illustrated) of the first conductivity type is encompassed in an upper portion of the N type epitaxial layer 302' and below the p body region 310' and surrounds a sidewall 3031' of the gate trench 303' The Ncs region 327' is introduced to avoid formation of a pinching off current path between the P-shield region 318' (PS1, as illustrated) and the gate trench 303', wherein the Ncs region 327' has a higher doping concentration than the N type epitaxial layer 302' for on-resistance reduction.

Figure 4A:
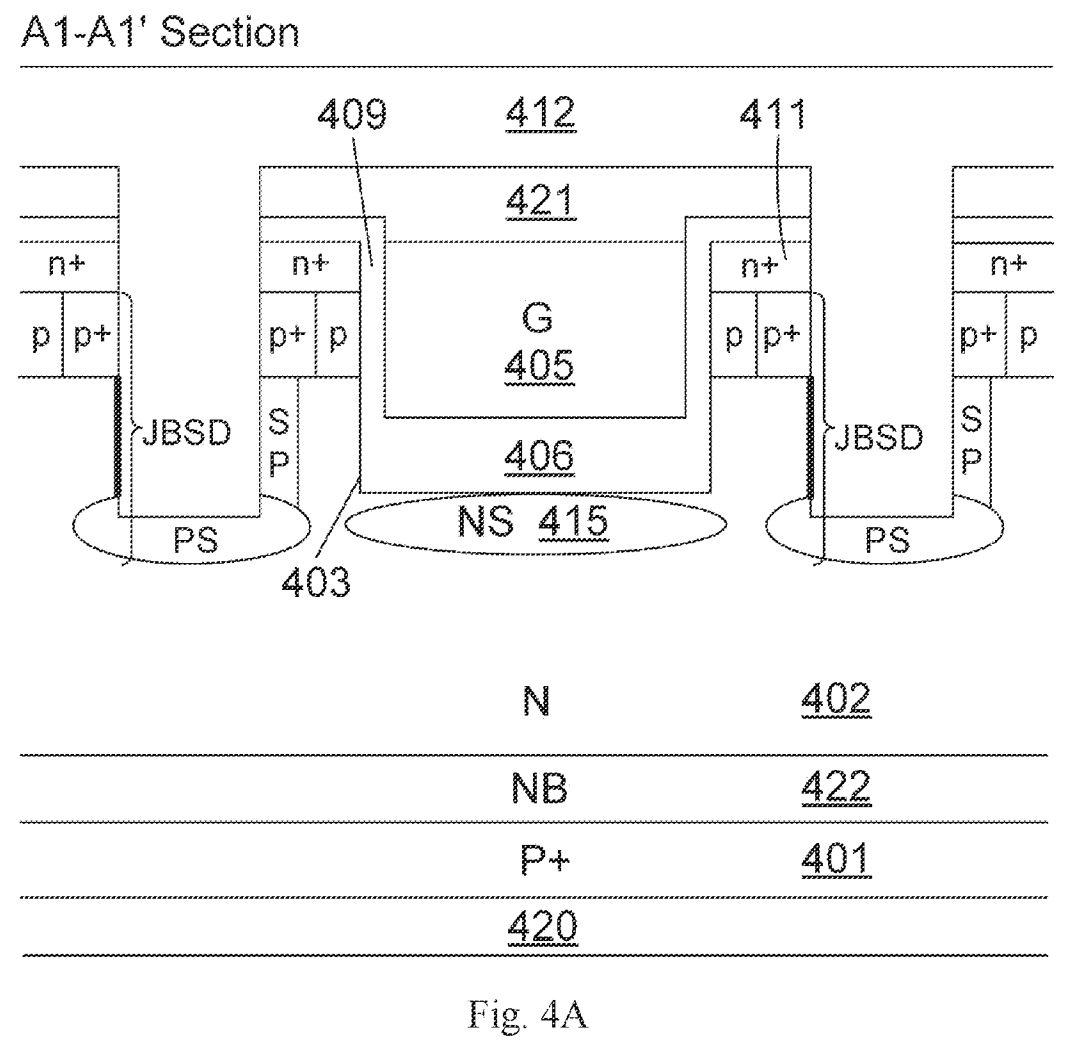

Please refer to FIG. 4A for another preferred A1-A1' cross-sectional view of FIG. 2A. The SiC power device representing an Insulating Gate Bipolar Transistor (IGBT) device has a similar structure to FIG. 2D, except for the different substrate and an additional N buffer layer. In this invention, the IGBT is formed on a P+ substrate 401, and the invention in FIG. 4A further comprises an N buffer layer 422 (NB, as illustrated) with a resistivity Rb sandwiched between the P+ substrate 401 and the N type epitaxial layer 402, and the N type epitaxial layer 402 comprises a single epitaxial layer having a uniform doping concentration with a resistivity R, wherein R>Rb.

Figure 4B:
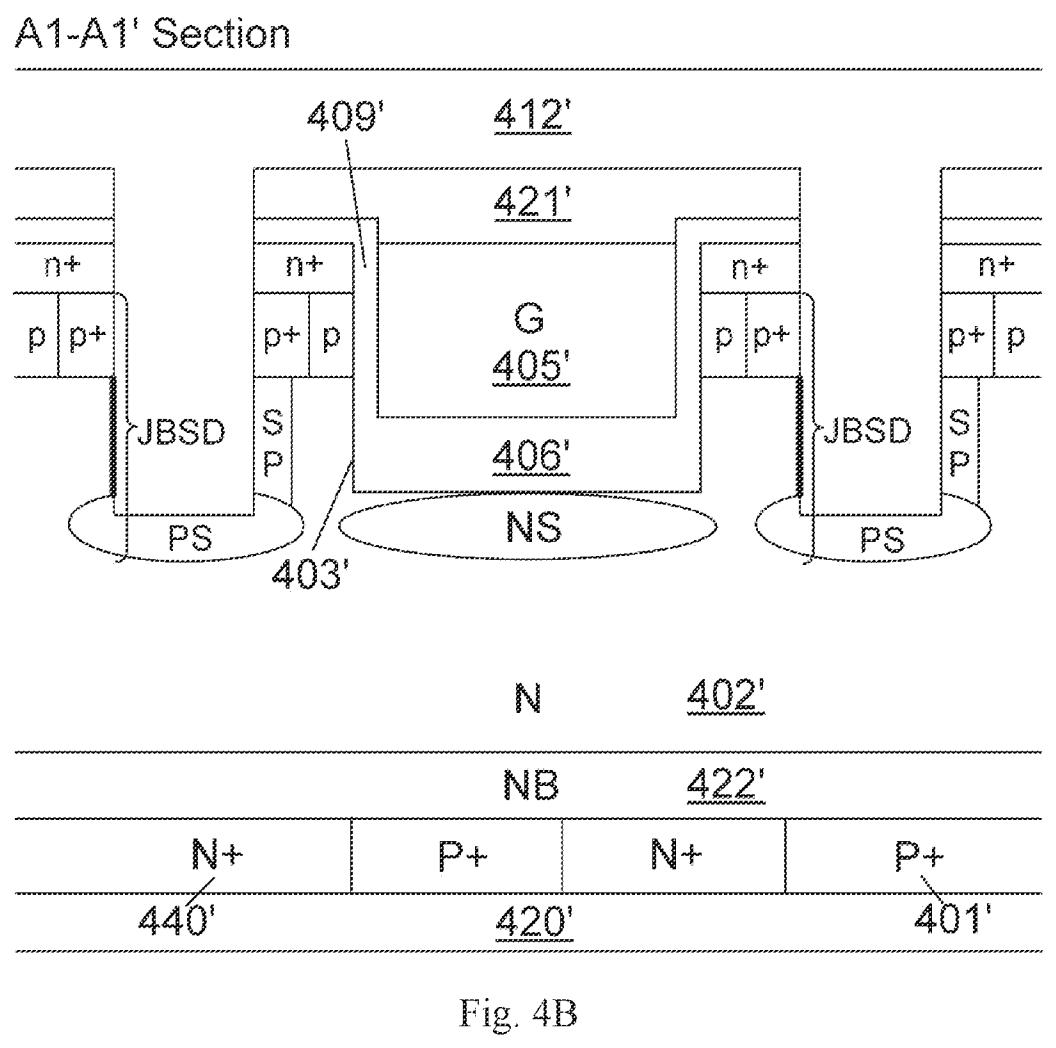

Please refer to FIG. 4B for another preferred A1-A1' cross-sectional view of FIG. 2A. The SiC power device has a similar structure to FIG. 4A, except that, the IGBT in FIG. 4B further comprises a plurality of heavily doped N+ regions 440' in the Pt substrate 401' to form a plurality of alternating Pt and N+ regions in the substrate.

Please refer to FIG. 5A for another preferred A1-A1' cross-sectional view of FIG. 2A. The SiC SGT device has a similar structure to FIG. 2B, except that in the present structure, a current spreading layer 527 (Ncs, as illustrated) of the first conductivity type is disposed below the p body region 510 and surrounds upper portions of sidewalls of the gate trench 503. The Ncs region 527 is introduced to avoid formation of a pinching off current path between the PS region 518 and the gate trench 503, wherein the Ncs region 527 has a higher doping concentration than the N type epitaxial layer 502 for on-resistance reduction. Besides, in FIG. 5A, inside each of the gate trenches 503, a shielded gate electrode 507 (SG, as illustrated) is disposed in the lower portion and a gate electrode 505 (G, as illustrated) is disposed in the upper portion above the shielded gate electrode 507. The shielded gate electrode 507 is insulated from the adjacent epitaxial layer by a first insulating film 506, and the gate electrode 505 is insulated from the adjacent epitaxial layer by a gate oxide 509, wherein the gate oxide 509 surrounds the gate electrode 505 and has a thinner thickness than the first insulating film 506 which has a uniform thickness along trench sidewalls, meanwhile, the shielded gate electrode 507 and the gate electrode 505 are insulated from each other by an IPO film 508.

Figure 5B:
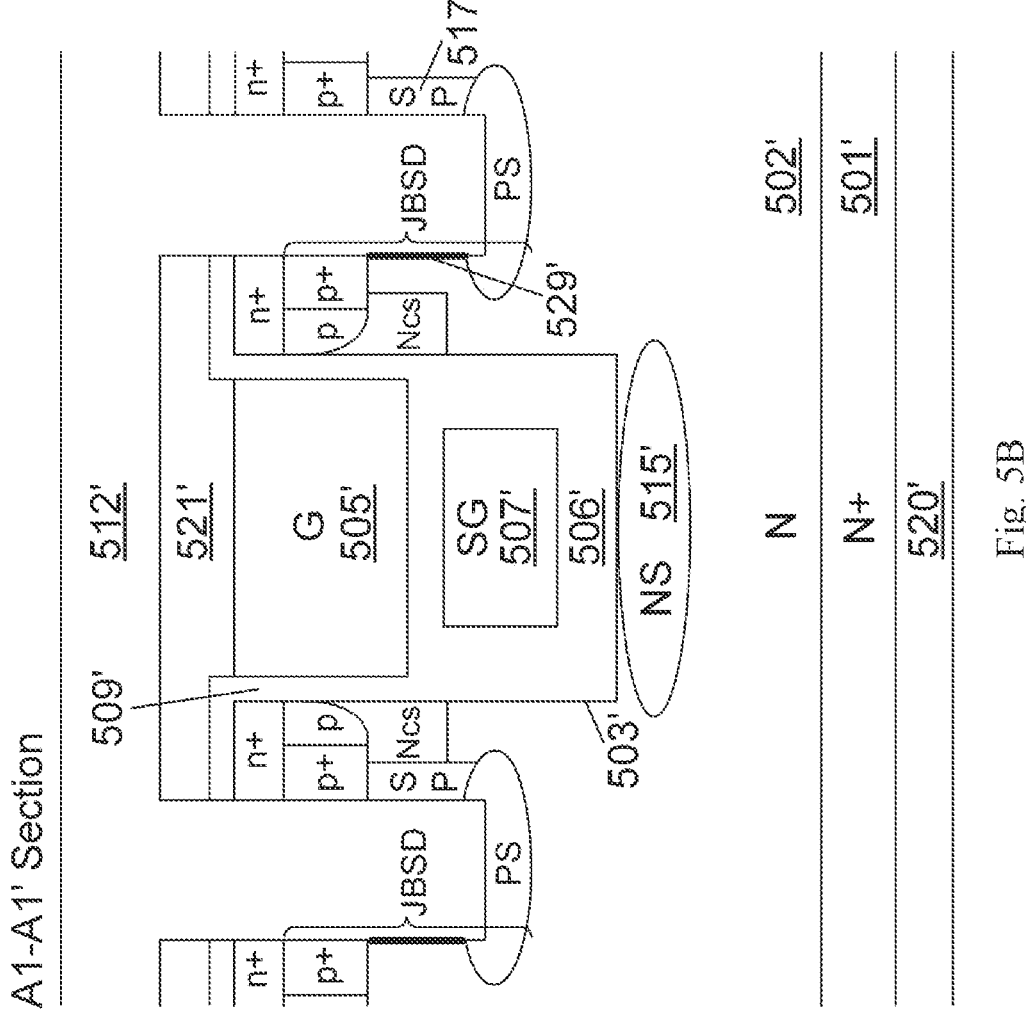
FIG. 5B is a cross-sectional view showing another preferred A1-A1' cross section of FIG. 2A according to the present invention.

Please refer to FIG. 5B for another preferred A1-A1' cross-sectional view of FIG. 2A. The SiC SGT device has a similar structure to FIG. 5A, except that in the present invention, an N-shield region 515' (NS, as illustrated) for gate oxide protection is disposed below the gate trench 503' in the N type epitaxial layer 502' with a doping concentration higher than that of the N type epitaxial layer 502'.

Figure 6:
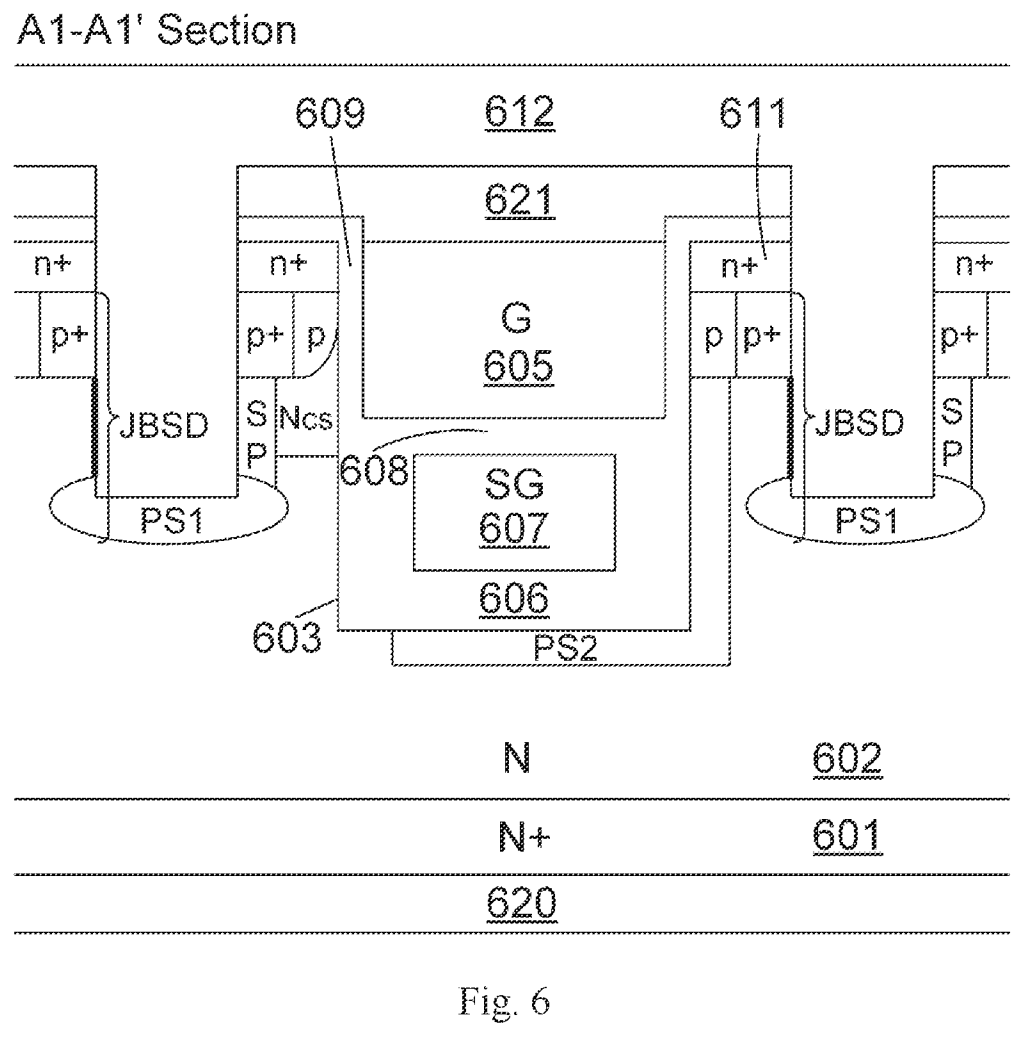

Please refer to FIG. 6 for another preferred A1-A1' cross-sectional view of FIG. 2A. The SiC SGT device has a similar structure to FIG. 3B, except for the different gate trench structure. In FIG. 6A, inside each of the gate trenches 603, a shielded gate electrode 607 (SG, as illustrated) is disposed in the lower portion and a gate electrode 605 (G, as illustrated) is disposed in the upper portion above the shielded gate electrode 607. The shielded gate electrode 607 is insulated from the adjacent epitaxial layer by a first insulating film 606, and the gate electrode 605 is insulated from the adjacent epitaxial layer by a gate oxide 609, wherein the gate oxide 609 surrounds the gate electrode 605 and has a thinner thickness than the first insulating film 606 which has a uniform thickness along trench sidewalls, meanwhile, the shielded gate electrode 607 and the gate electrode 605 are insulated from each other by an IPO film 608.

Figure 7A:
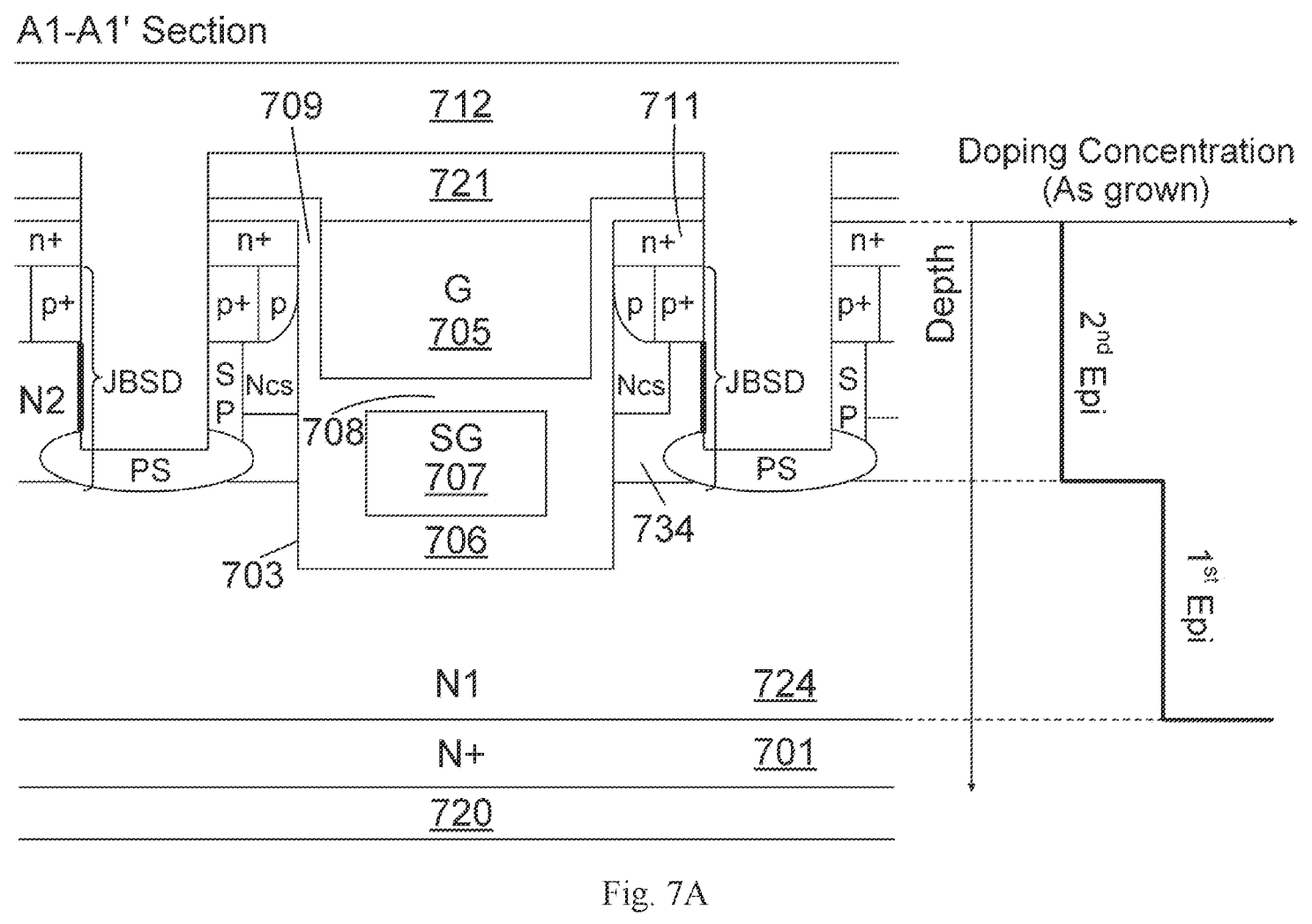

Please refer to FIG. 7A for another preferred A1-A1' cross-sectional view of FIG. 2A, wherein the doping concentration variations of the N type epitaxial layer as grown are depicted along the vertical direction. The SiC SGT device has a similar structure to FIG. 5A, except for the different epitaxial layers. In this invention, the N type epitaxial layer comprises two stepped epitaxial layers of different doping concentrations including a bottom first epitaxial layer 724 (N1, as illustrated) with a doping concentration D1 and a top second epitaxial layer 734 (N2, as illustrated) above the bottom first epitaxial layer 724 with a doping concentration D2, wherein D2<D1, to increase the breakdown voltage and lower the specific on-resistance.

Figure 7B:
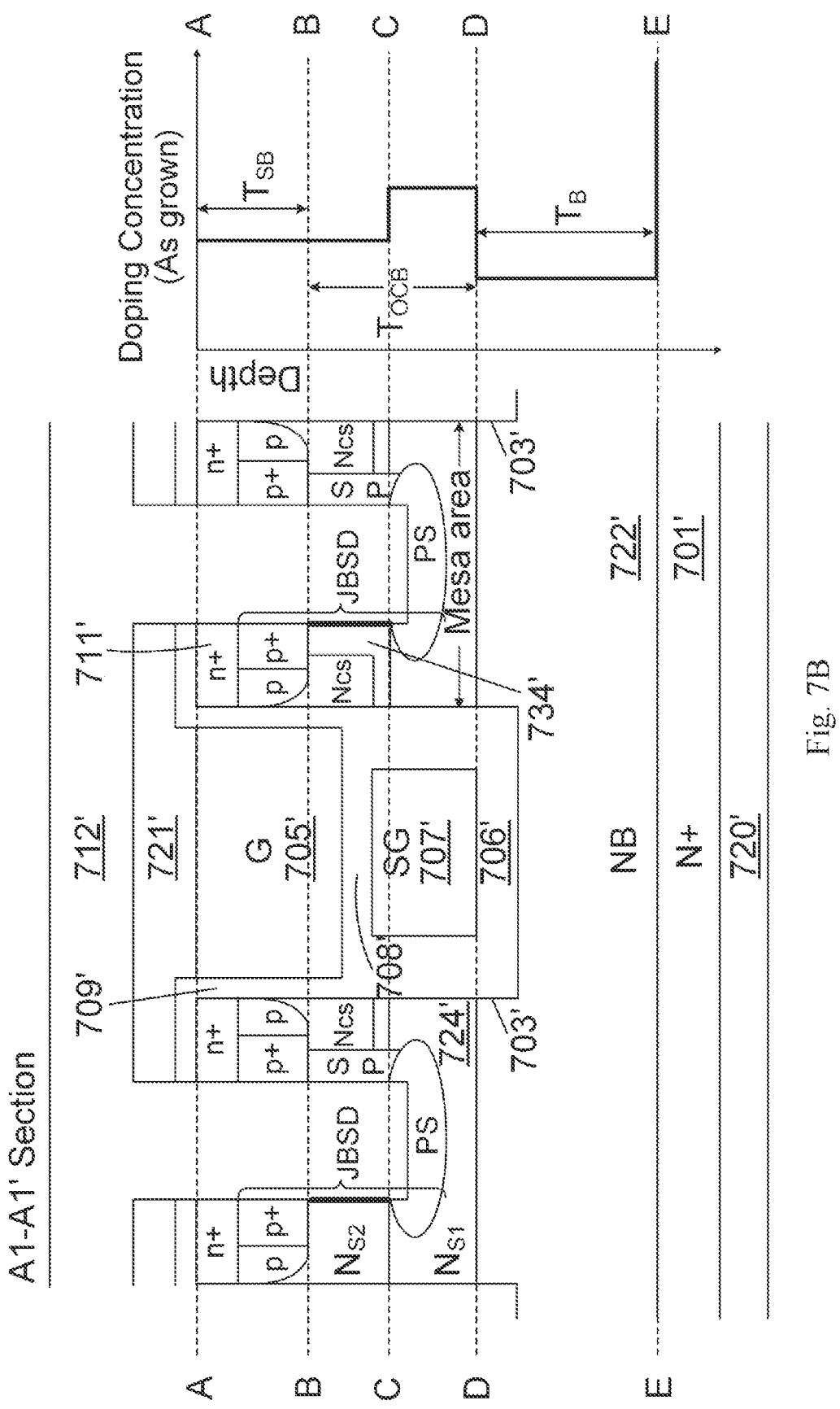
FIG. 7B is a cross-sectional view showing another preferred A1-A1' cross section of FIG. 2A according to the present invention, wherein the doping concentration variations of the N type epitaxial layer as grown are depicted along the vertical direction.

Please refer to FIG. 7B for another preferred A1-A1' cross-sectional view of FIG. 2A, wherein the doping concentration variations of the N type epitaxial layer as grown are depicted along the vertical direction. The SiC SGT device has a similar structure to FIG. 5A, except for the different epitaxial layers. In FIG. 7B, the epitaxial layer comprises a source-body (SB) region TSB (between A-A and B-B lines) on a top portion of the epitaxial layer, an oxide charge balance (OCB) region $T_{OCB}$ (between B-B and D-D lines) formed in a mesa area between the two adjacent gate trenches 703' below the body regions 710' and above a bottom of the shielded gate electrode 707' and a buffer region TB formed between the N+ substrate 701' and a bottom of the shielded gate electrode 707'(between D-D and E-E lines), the epitaxial layer in the OCB region has two stepped epitaxial layers with different doping concentrations including a bottom first epitaxial layer 724' ($N_{S1}$, as illustrated between C-C and D-D lines) above the buffer epitaxial layer 722' (NB, as illustrated between D-D and E-E lines) with a doping concentration D1, and a top second epitaxial layer 734' ($N_{S2}$, as illustrated between B-B and C-C lines) above the first epitaxial layer 724' with a doping concentration D2, wherein D2<D1. Moreover, the epitaxial layer in the SB region TSB has a doping concentration same as that of the top second epitaxial layer 734' of the MSE layers in the OCB region $T_{OCB}$, and the buffer epitaxial layer 722' has a doping concentration $D_B$ lower than doping concentrations of the MSE layers in the OCB region $T_{OCB}$.

Figure 8:
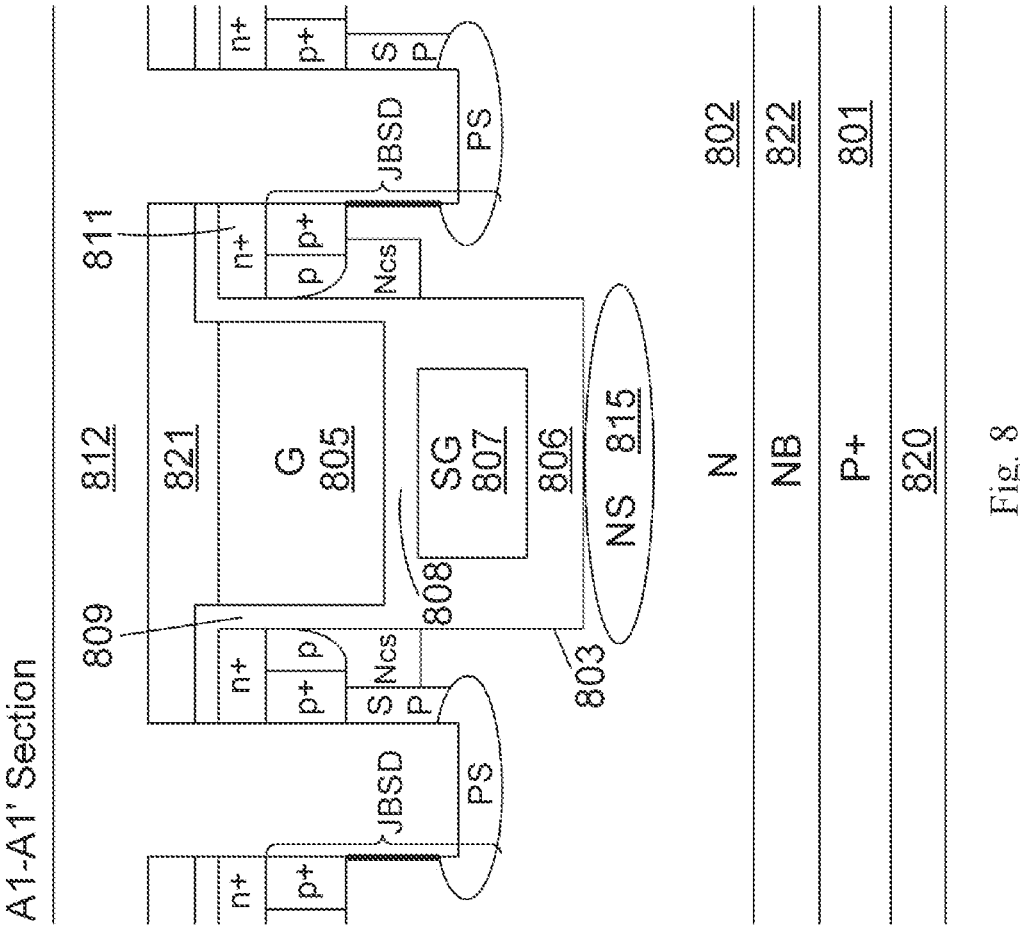
FIG. 8 is a cross-sectional view showing another preferred A1-A1' cross section of FIG. 2A according to the present invention.

Please refer to FIG. 8 for another preferred A1-A1' cross-sectional view of FIG. 2A. The SiC SGT device representing an IGBT device has a similar structure to FIG. 5B, except for the different substrate and an additional N buffer layer. In this invention, the IGBT is formed on a P+ substrate 801, and the invention in FIG. 8 further comprises an N buffer layer 822 (NB, as illustrated) with a resistivity Rb sandwiched between the P+ substrate 801 and the N type epitaxial layer 802, and the N type epitaxial layer 802 comprises a single epitaxial layer having a uniform doping concentration with a resistivity R, wherein R>Rb.

Figure 9:
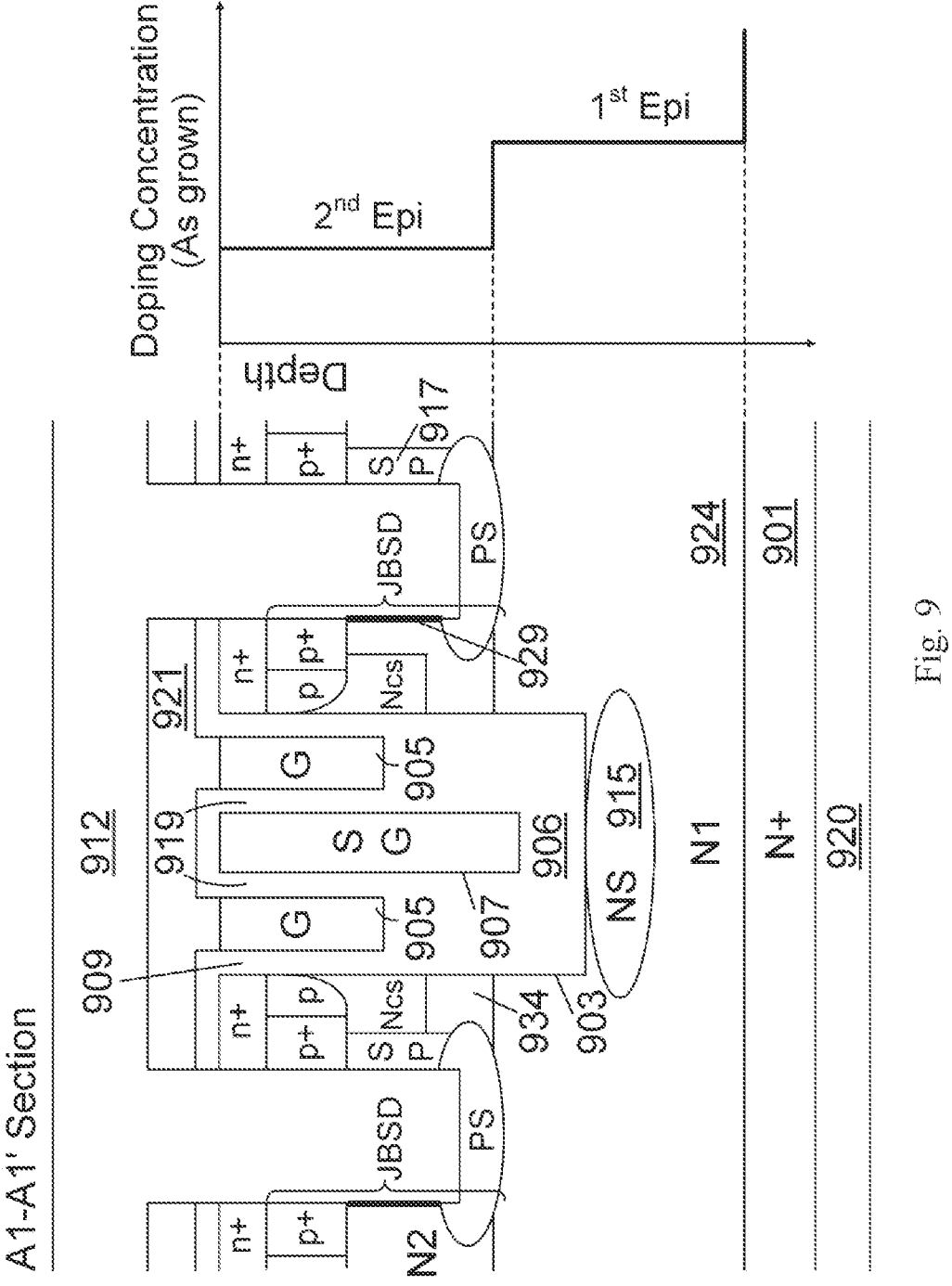
FIG. 9 is a cross-sectional view showing another preferred A1-A1' cross section of FIG. 2A according to the present invention, wherein the doping concentration variations of the N type epitaxial layer as grown are depicted along the vertical direction.

Please refer to FIG. 9 for another preferred A1-A1' cross-sectional view of FIG. 2A, wherein the doping concentration variations of the N type epitaxial layer as grown are depicted along the vertical direction. The SiC SGT device has a similar device structure to FIG. 7A, except for the different gate trench structure and an additional N-shield zone. Inside each of the gate trenches 903, a shielded gate electrode 907 (SG, as illustrated) is disposed in the middle and a pair of split gate electrodes 905 (G, as illustrated) are disposed surrounding upper portions of the shielded electrode 907. The second insulating film 919 isolating the shielded gate electrode 907 and the gate electrode 905 is covering on an upper portion of the shielded gate electrode 907, wherein the second insulating film 919 is formed at the same time during growing the gate oxide 909 in the manufacturing process. Besides, an additional N-shield zone 915 (NS, as illustrated) for gate oxide protection is disposed below the gate trench in the bottom first N type epitaxial layer 924.

Figure 10:
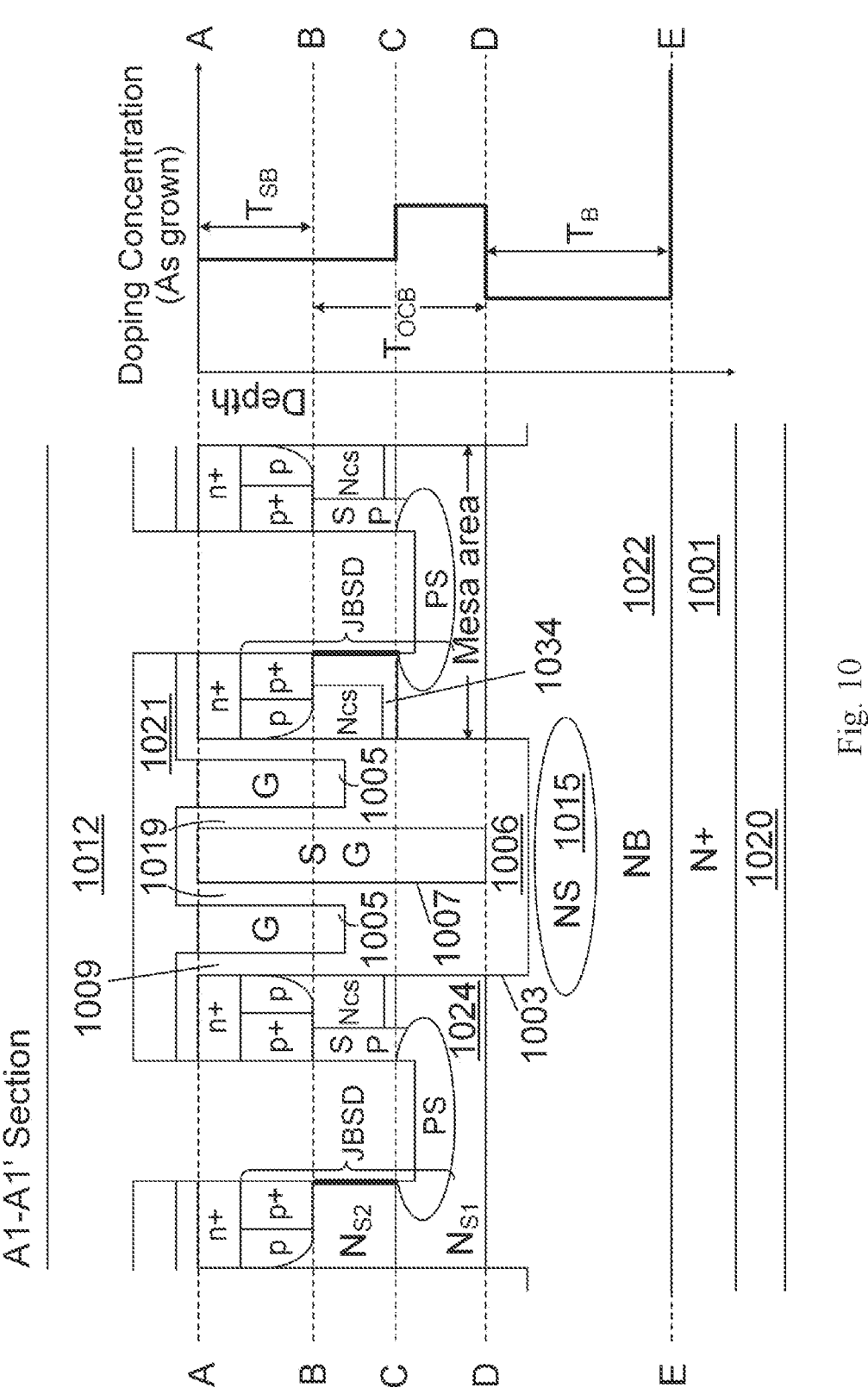
FIG. 10 is a cross-sectional view showing another preferred A1-A1' cross section of FIG. 2A according to the present invention, wherein the doping concentration variations of the N type epitaxial layer as grown are depicted along the vertical direction.

Please refer to FIG. 10 for another preferred A1-A1' cross-sectional view of FIG. 2A, wherein the doping concentration variations of the N type epitaxial layer as grown are depicted along the vertical direction. The SiC SGT device has a similar device structure to FIG. 7B, except for the different gate trench structure and an additional N-shield zone. Inside each of the gate trenches 1003, a shielded gate electrode 1007 (SG, as illustrated) is disposed in the middle and a pair of split gate electrodes 1005 (G, as illustrated) are disposed surrounding upper portions of the shielded electrode 1007. The second insulating film 1019 isolating the shielded gate electrode 1007 and the gate electrode 1005 is covering on an upper portion of the shielded gate electrode 1007, wherein the second insulating film 1019 is formed at the same time during growing the gate oxide 1009 in the manufacturing process. Besides, an additional N-shield zone 1015 (NS, as illustrated) for gate oxide protection is disposed below the gate trench in the N type buffer layer 1022.

Figure 11:
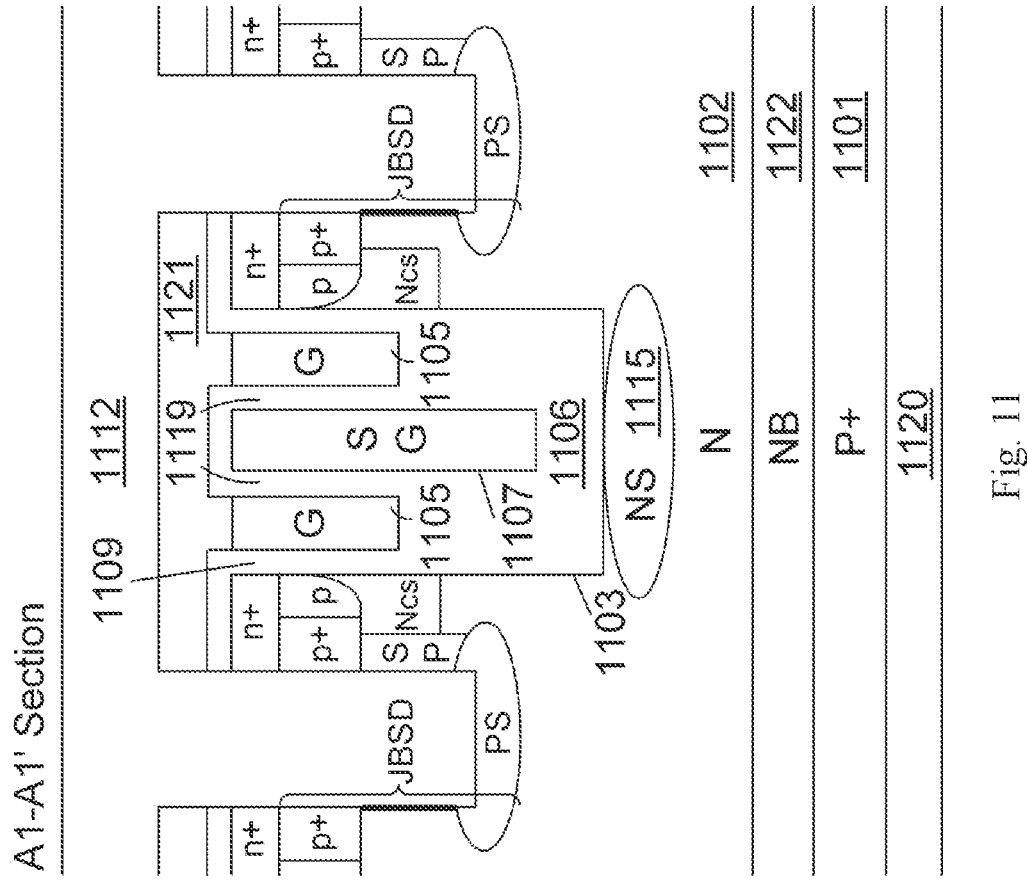
FIG. 11 is a cross-sectional view showing another preferred A1-A1' cross section of FIG. 2A according to the present invention.

Please refer to FIG. 11 for another preferred A1-A1' cross-sectional view of FIG. 2A. The SiC power device representing an IGBT device has a similar structure to FIG. 8, except for the different gate trench structure. Inside each of the gate trenches 1103, a shielded gate electrode 1107 (SG, as illustrated) is disposed in the middle and a pair of split gate electrodes 1105 (G, as illustrated) are disposed surrounding upper portions of the shielded electrode 1107. The second insulating film 1119 isolating the shielded gate electrode 1107 and the gate electrode 1105 is covering on an upper portion of the shielded gate electrode 1107, wherein the second insulating film 1119 is formed at the same time during growing the gate oxide 1109 in the manufacturing process.

Figure 12A:
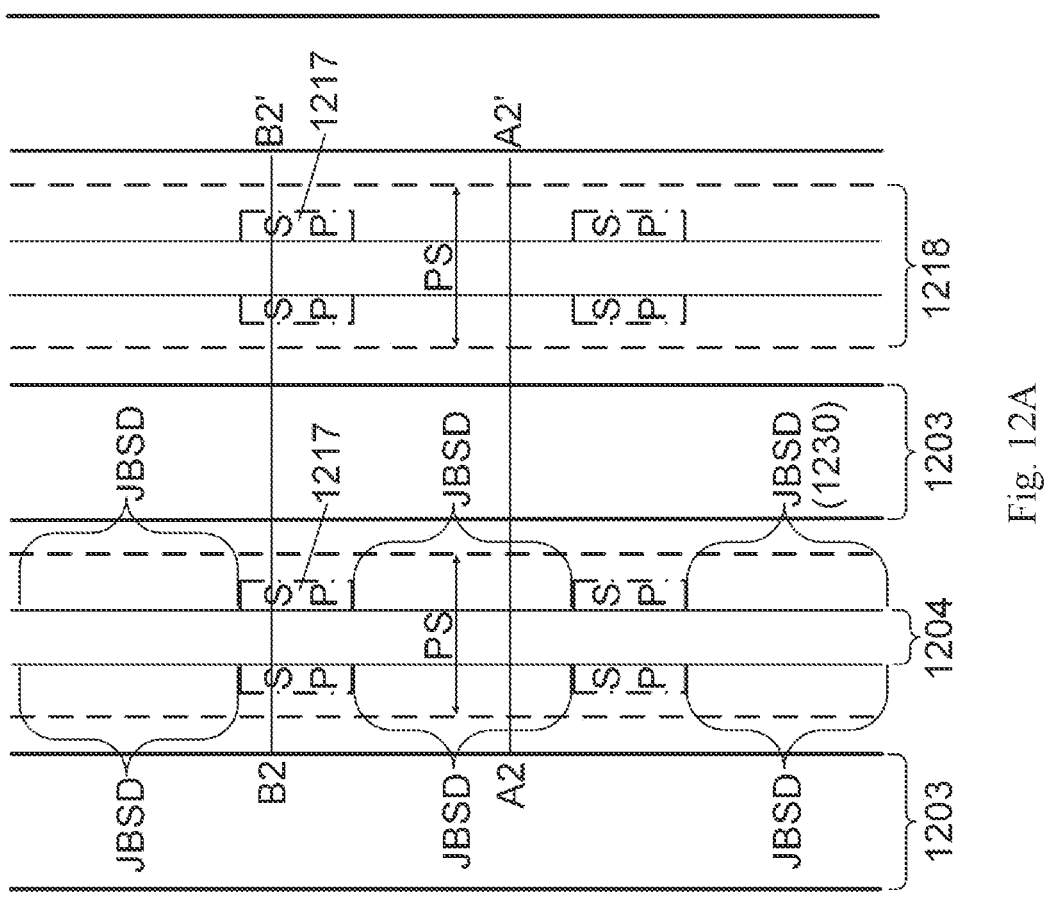
FIG. 12A is a top view of another preferred embodiment for a trench semiconductor power device with stripe cells layout according to the present invention.

Please refer to FIG. 12A for a top view of a SiC power device with stripe cells layout. A gate trench 1203 is spaced apart from the SBSC trench 1204, wherein the gate trench 1203 has a stripe shape and the SBSC trench 1204 is surrounded by a P-shield (PS) region 1218. According to this invention, sidewall P (SP) regions 1217 and junction barrier Schottky diode (JBSD) regions 1230 are alternately formed along both sidewalls of the SBSC trench 1204.

Figure 12B:
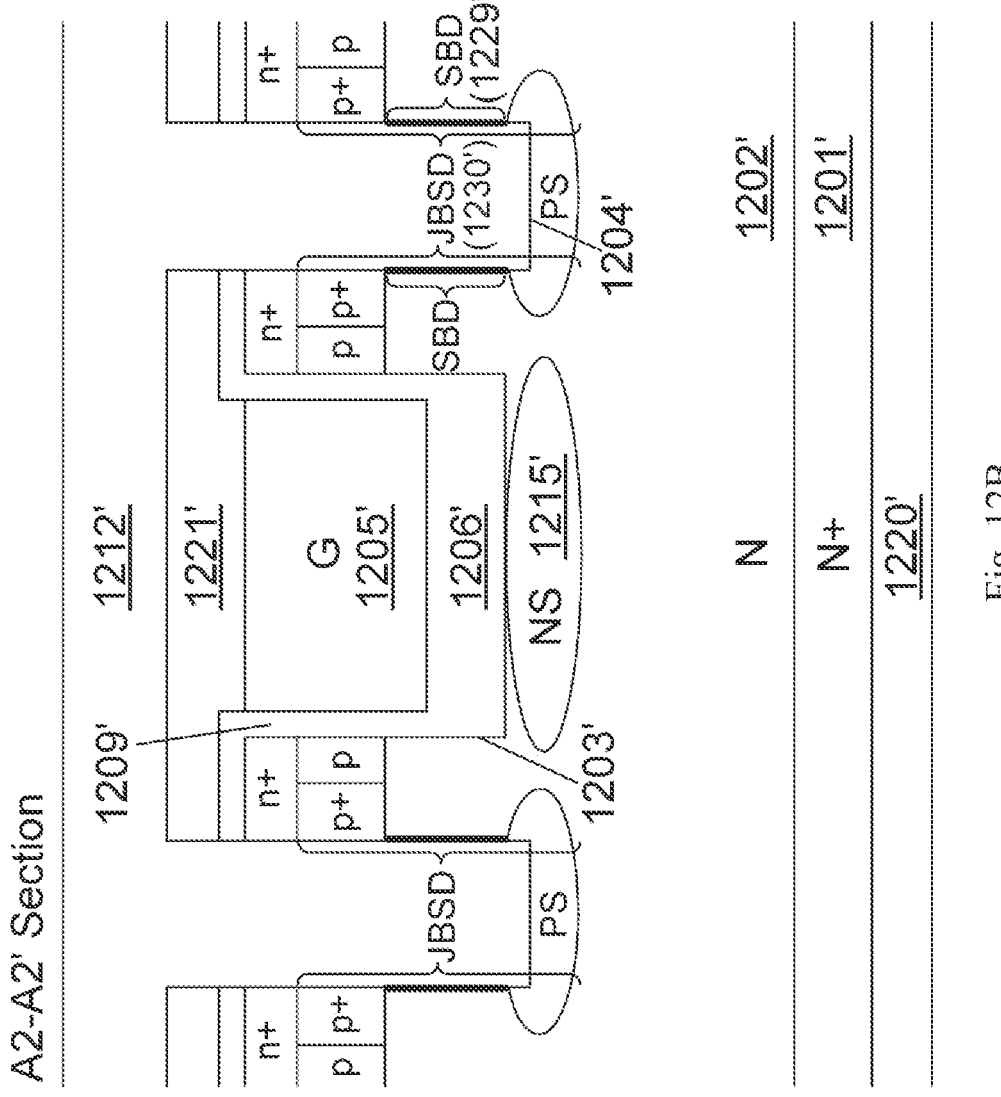
FIG. 12B is a cross-sectional view showing a preferred A2-A2' cross section of FIG. 12A according to the present invention.

Please refer to FIG. 12B for a preferred A2-A2' cross-sectional view of FIG. 12A. The SiC power device has a similar device structure to FIG. 2D, except that the sidewall P regions 217' (SP, as illustrated) in FIG. 2D are replaced by the SBD regions 1229' in the present invention. According to the present invention, JBSD regions 1230' are formed on both sidewalls of the SBSC trench 1204'.

Figure 12C:
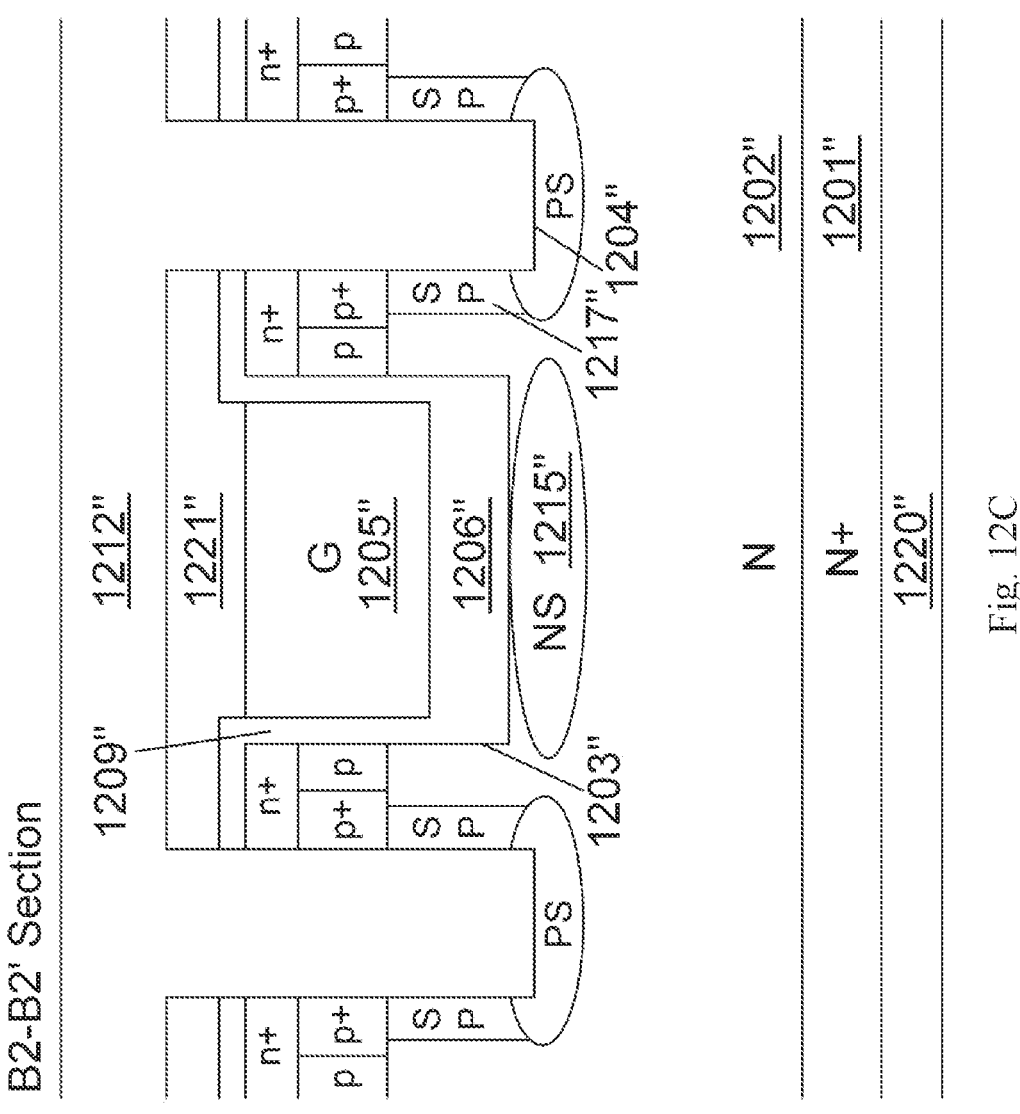
FIG. 12C is a cross-sectional view showing a preferred B2-B2' cross section of FIG. 12A according to the present invention.

Please refer to FIG. 12C for a preferred B2-B2' cross-sectional view of FIG. 12A. The SiC power device has a similar device structure to FIG. 2D, except that the SBD regions 229''' in FIG. 2D are replaced by the sidewall P regions 1217''. According to the present invention, sidewall P regions 1217'' (SP, as illustrated) are formed on both sidewalls of the SBSC trench 1204''.

Figure 13:
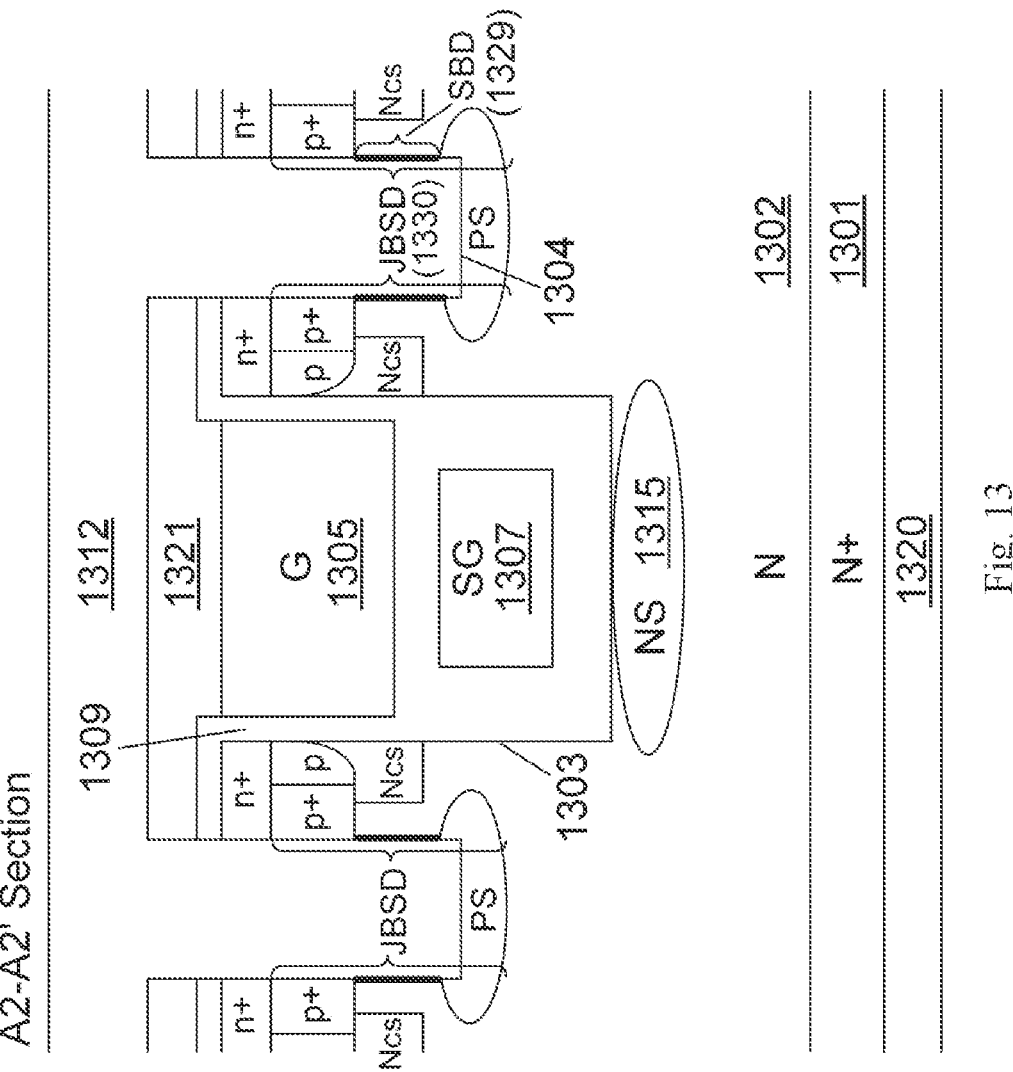
FIG. 13 is a cross-sectional view showing another preferred A2-A2' cross section of FIG. 12A according to the present invention.

Please refer to FIG. 13 for another preferred A2-A2' cross-sectional view of FIG. 12A. The SiC SGT device has a similar device structure to FIG. 5B, except that the sidewall P regions (SP, as illustrated) 517' in FIG. 5B are replaced by the SBD regions 1329 in the present invention. According to the present invention. JBSD regions 1330 are formed on both sidewalls of the SBSC trench 1304.

Figure 14:
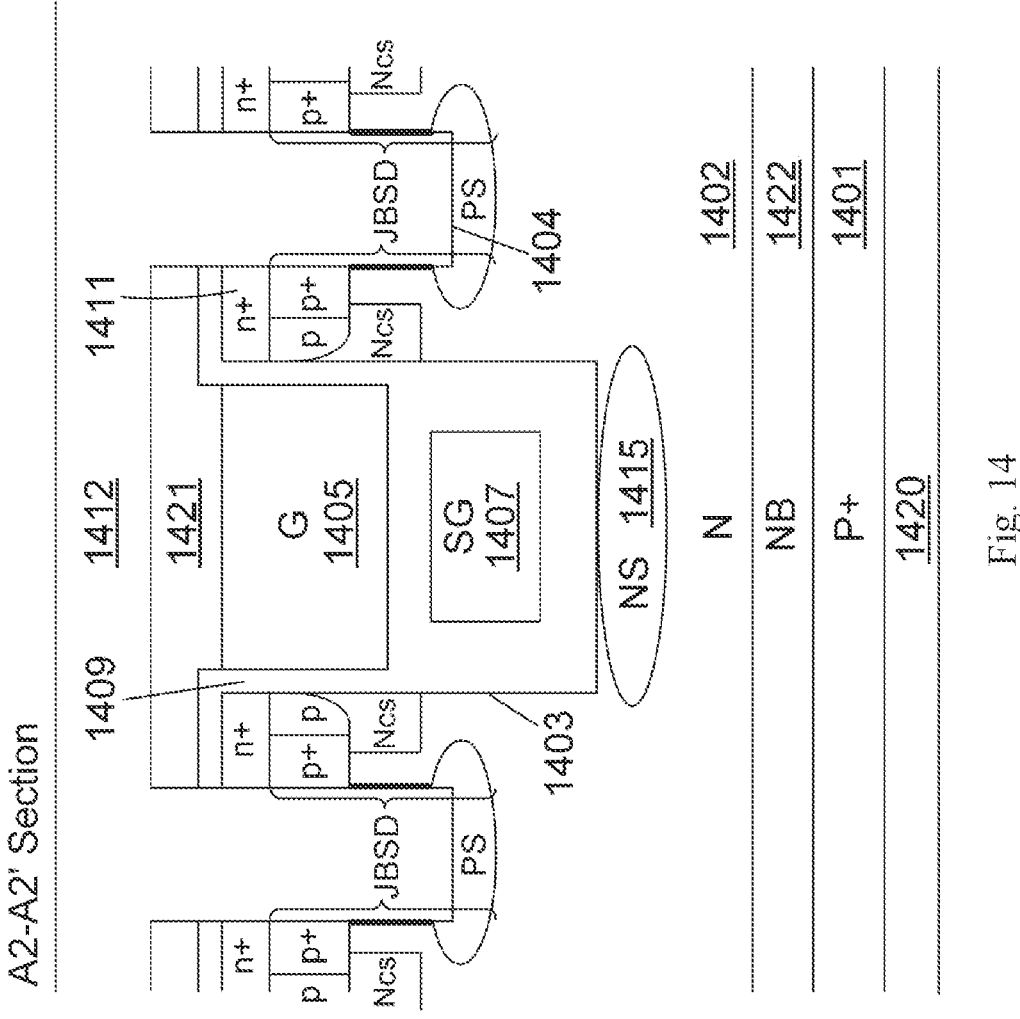
FIG. 14 is a cross-sectional view showing another preferred A2-A2' cross section of FIG. 12A according to the present invention.

Please refer to FIG. 14 for another preferred A2-A2' cross-sectional view of FIG. 12A. The SiC SGT power device representing an IGBT device has a similar structure to FIG. 13, except for the different substrate and an additional N buffer layer. In this invention, the IGBT is formed on a P+ substrate 1401, and the invention in FIG. 14 further comprises an N buffer layer 1422 (NB, as illustrated) with a resistivity Rb sandwiched between the P+ substrate 1401 and the N type epitaxial layer 1402, and the N type epitaxial layer 1402 comprises a single epitaxial layer having a uniform doping concentration with a resistivity R, wherein R>Rb.

Figure 15:
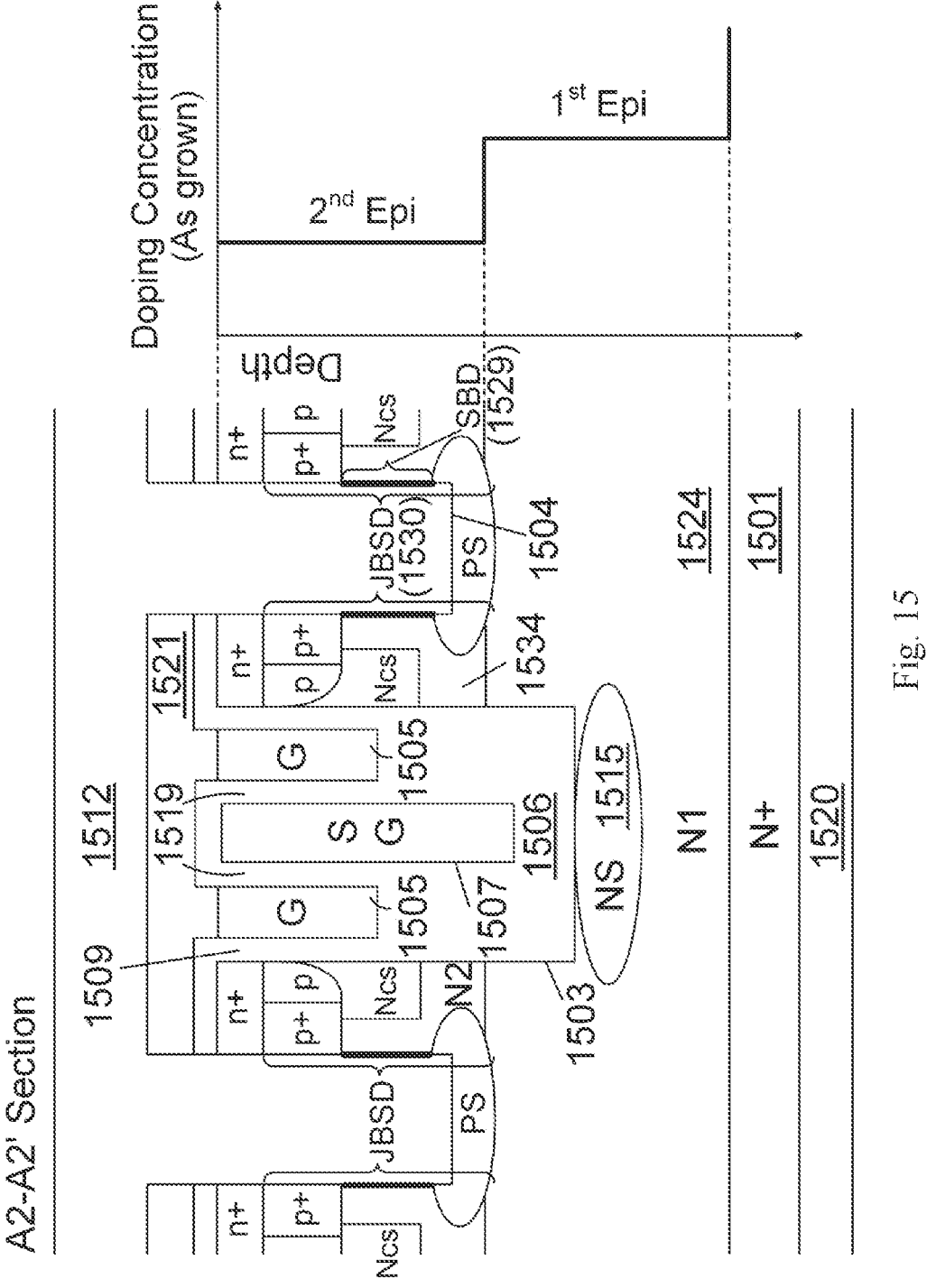
FIG. 15 is a cross-sectional view showing another preferred A2-A2' cross section of FIG. 12A according to the present invention, wherein the doping concentration variations of the N type epitaxial layer as grown are depicted along the vertical direction.

Please refer to FIG. 15 for another preferred A2-A2' cross-sectional view of FIG. 12A, wherein the doping concentration variations of the N type epitaxial layer as grown are depicted along the vertical direction. The SiC SGT device has a similar device structure to FIG. 9, except that the sidewall P regions (SP, as illustrated) 917 in FIG. 9 are replaced by the SBD regions 1529 in the present invention. According to the present invention, JBSD regions 1530 are formed on both sidewalls of the SBSC trench 1504.

Figure 16:
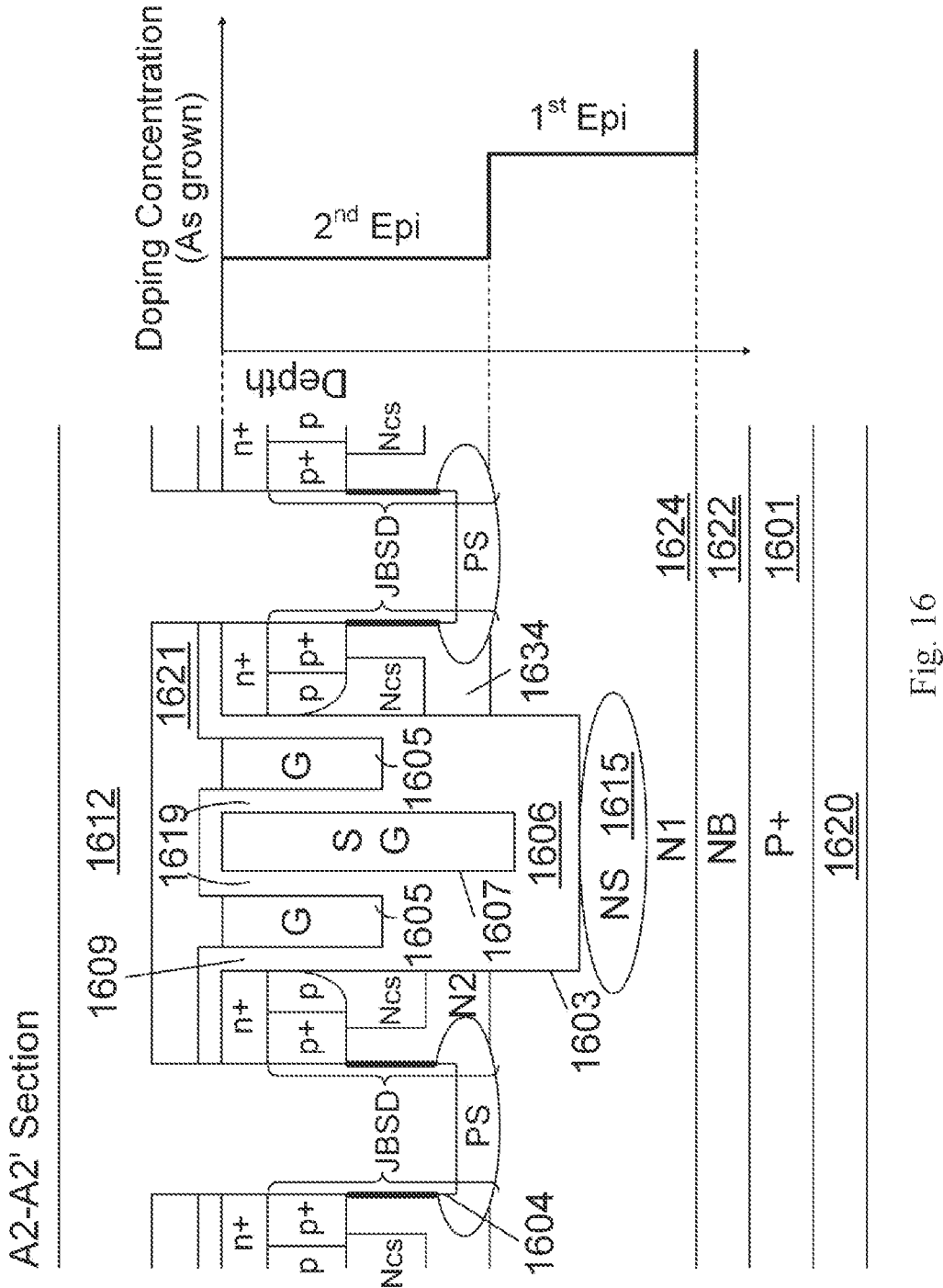
FIG. 16 is a cross-sectional view showing another preferred A2-A2' cross section of FIG. 12A according to the present invention, wherein the doping concentration variations of the N type epitaxial layer as grown are depicted along the vertical direction.

Please refer to FIG. 16 for another preferred A2-A2' cross-sectional view of FIG. 12A, wherein the doping concentration variations of the N type epitaxial layer as grown are depicted along the vertical direction. The SiC SGT device has a similar device structure to FIG. 15, except for the different substrate and an additional N buffer layer. In this invention, the IGBT is formed on a Pt substrate 1601, and the invention in FIG. 16 further comprises an N buffer layer 1622 (NB, as illustrated) sandwiched between the P+ substrate 1601 and the bottom first N type epitaxial layer 1624 (N1, as illustrated).

Figure 17:
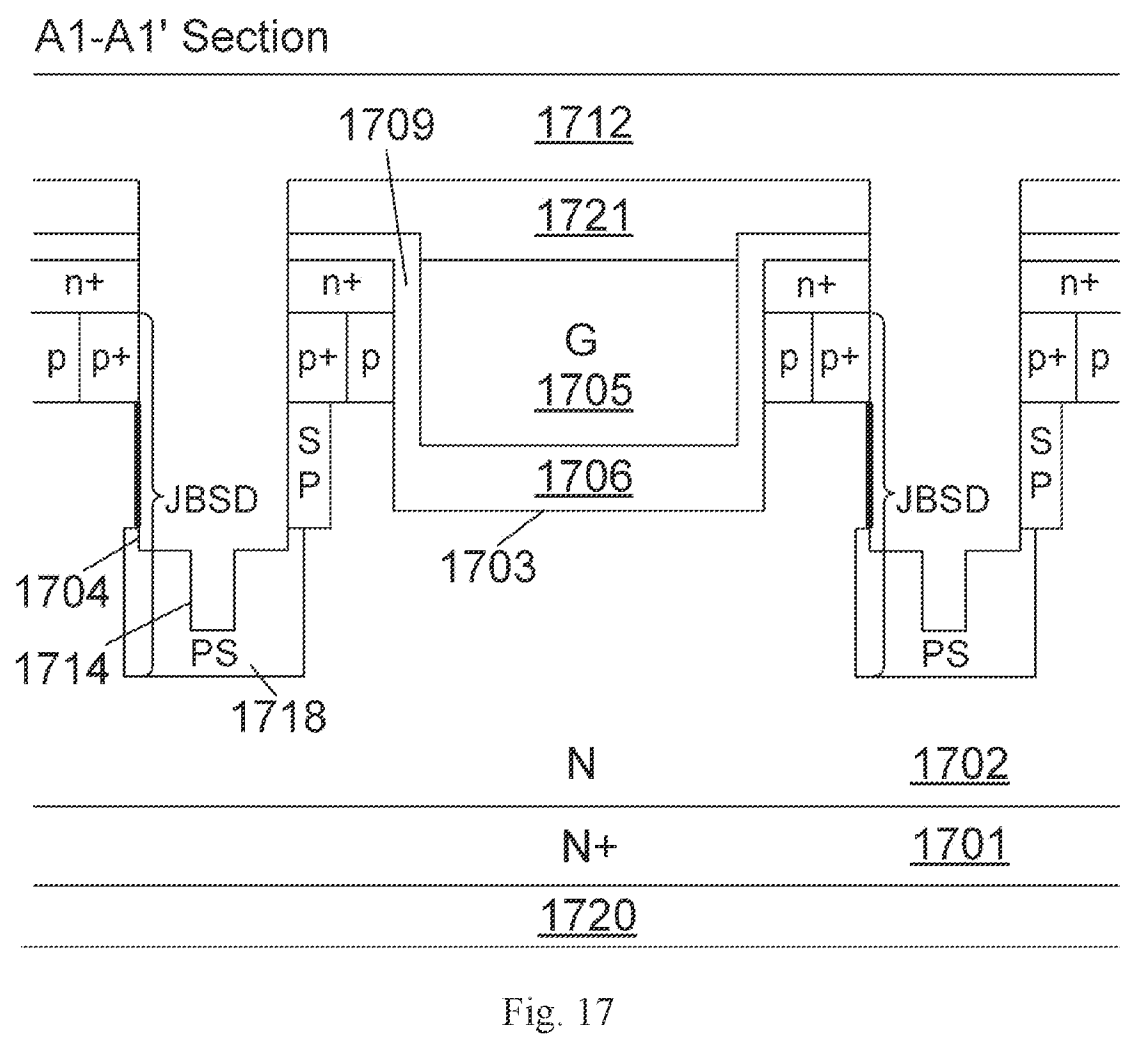

Please refer to FIG. 17 for another preferred A1-A1' cross-sectional view of FIG. 2A. The SiC power device has a similar device structure to FIG. 2B, except that the SBSC trench in the present invention having a first type SBSC trench 1704 and a second type SBSC trench 1714. The first type SBSC trench 1704 is formed above the second type SBSC trench 1714 and has a trench width wider than a trench width of the second type SBSC trench 1714, and a PS region 1718 is formed surrounding sidewalls and a bottom of the second type SBSC trench 1714.

Figure 18:
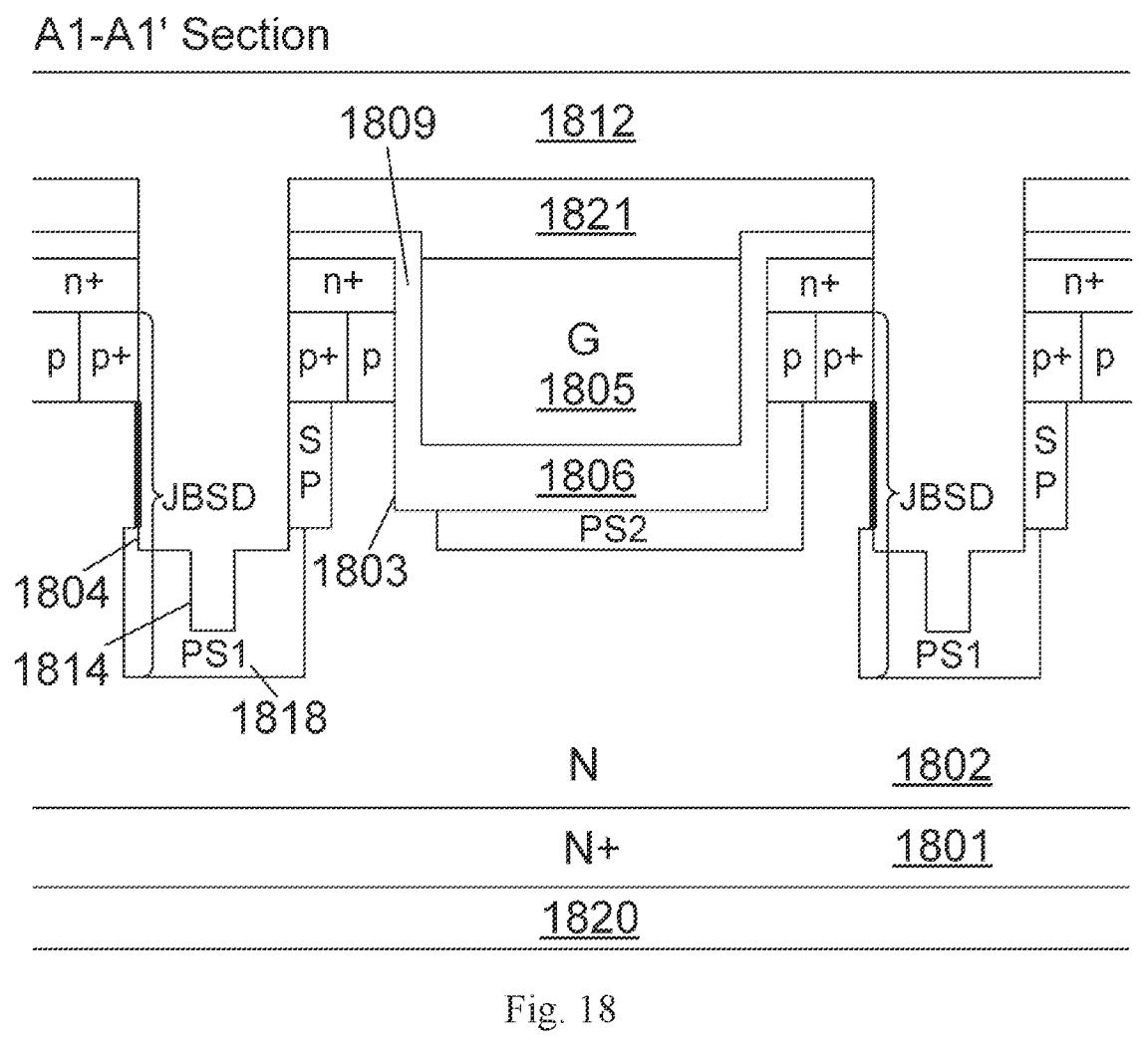

Please refer to FIG. 18 for another preferred A1-A1' cross-sectional view of of FIG. 2A. The SiC power device has a similar device structure to FIG. 3A, except that the SBSC trench in the present invention having a first type SBSC trench 1804 and a second type SBSC trench 1814. The first type SBSC trench 1804 is formed above the second type SBSC trench 1814 and has a trench width wider than a trench width of the second type SBSC trench 1814, and a PS1 region 1818 is formed surrounding sidewalls and a bottom of the second type SBSC trench 1814.

Figure 19:
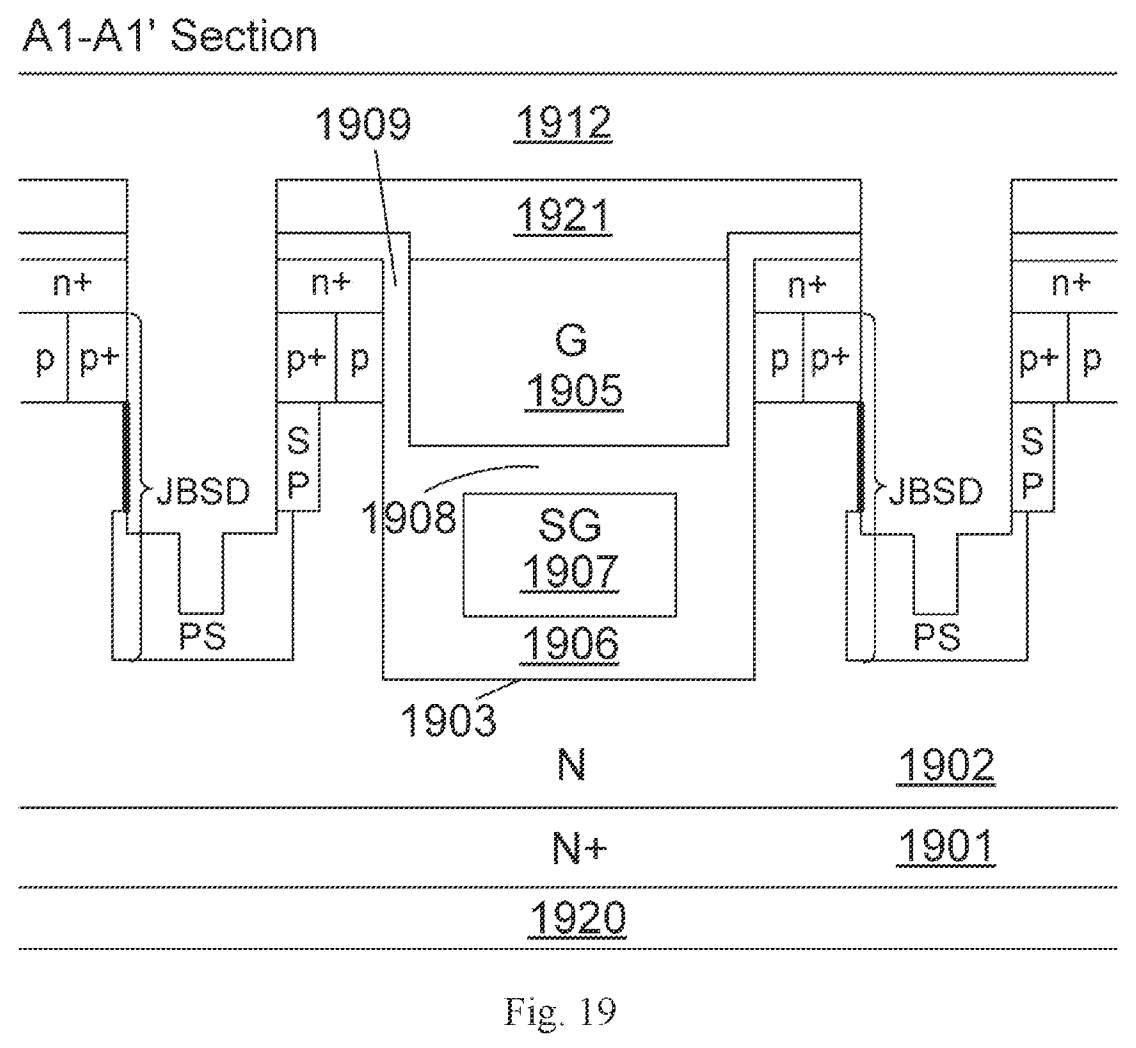

Please refer to FIG. 19 for another preferred A1-A1' cross-sectional view of FIG. 2A. The SiC device has a similar device structure to FIG. 17, except for the different gate trench structure. In FIG. 19, inside each of the gate trenches 1903, a shielded gate electrode 1907 (SG, as illustrated) is disposed in the lower portion and a gate electrode 1905 (G, as illustrated) is disposed in the upper portion above the shielded gate electrode 1907. The shielded gate electrode 1907 is insulated from the adjacent epitaxial layer by a first insulating film 1906, and the gate electrode 1905 is insulated from the adjacent epitaxial layer by a gate oxide 1909, wherein the gate oxide 1909 surrounds the gate electrode 1905 and has a thinner thickness than the first insulating film 1906 which has a uniform thickness along trench sidewalls, meanwhile, the shielded gate electrode 1907 and the gate electrode 1905 are insulated from each other by an IPO film 1908.

Please refer to FIG. 20 for another preferred A1-A1' cross-sectional view of FIG. 2A. The SiC power device has a similar device structure to FIG. 17, except that in the present invention, an N-shield region 2015 (NS, as illustrated) for gate oxide protection is disposed below the gate electrode 2005 (G, as illustrated) in the N type epitaxial layer 2002 with a doping concentration higher than that of the N type epitaxial layer 2002. Besides, a current spreading layer 2027 (Ncs, as illustrated) of the first conductivity type is encompassed in an upper portion of the N type epitaxial layer 2002 and below the p body region 2010 and surrounds at least sidewalls of the gate electrode 2005. The Ncs region 2027 is introduced to avoid formation of a pinching off current path between the PS region 2018 (PS, as illustrated) and the gate trench 2003, wherein the Ncs region 2027 has a higher doping concentration than that of the N type epitaxial layer 2002 for on-resistance reduction.

Figure 21:
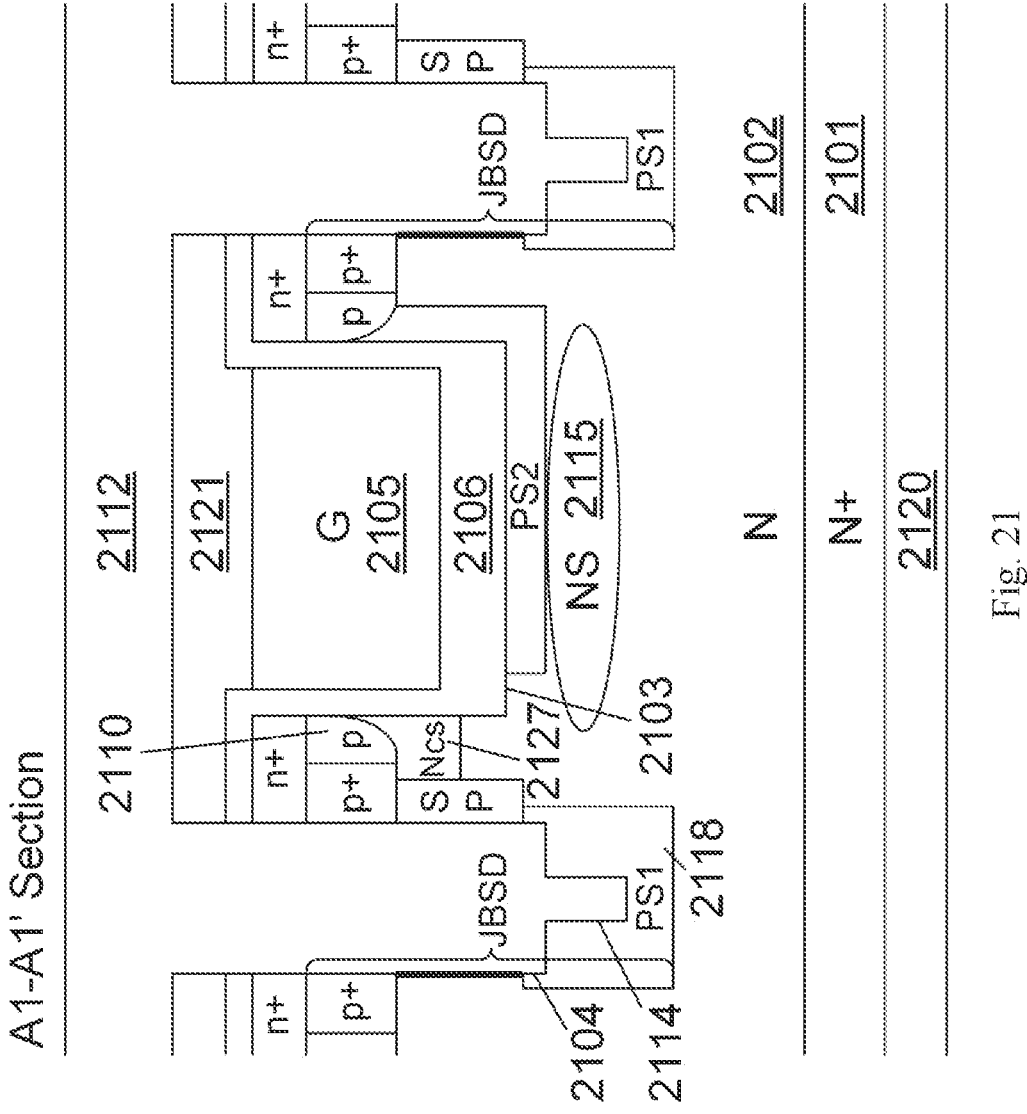
FIG. 21 is a cross-sectional view showing another preferred A1-A1' cross section of FIG. 2A according to the present invention.

Please refer to FIG. 21 for another preferred A1-A1' cross-sectional view of FIG. 2A. The SiC device has a similar device structure to FIG. 18, except that in the present invention, an N-shield region 2115 (NS, as illustrated) for gate oxide protection is disposed below the gate electrode 2105 (G, as illustrated) in the N type epitaxial layer 2102 with a doping concentration higher than that of the N type epitaxial layer 2102. Besides, a current spreading layer 2127 (Ncs, as illustrated) of the first conductivity type is encompassed in an upper portion of the N type epitaxial layer 2102 and below the p body region 2110 and surrounds at least sidewalls of the gate electrode 2105. The Ncs region 2127 is introduced to avoid formation of a pinching off current path between the PS region 2118 (PS1, as illustrated) and the gate trench 2103, wherein the Ncs region 2127 has a higher doping concentration than that of the N type epitaxial layer 2102 for on-resistance reduction.

Figure 22:
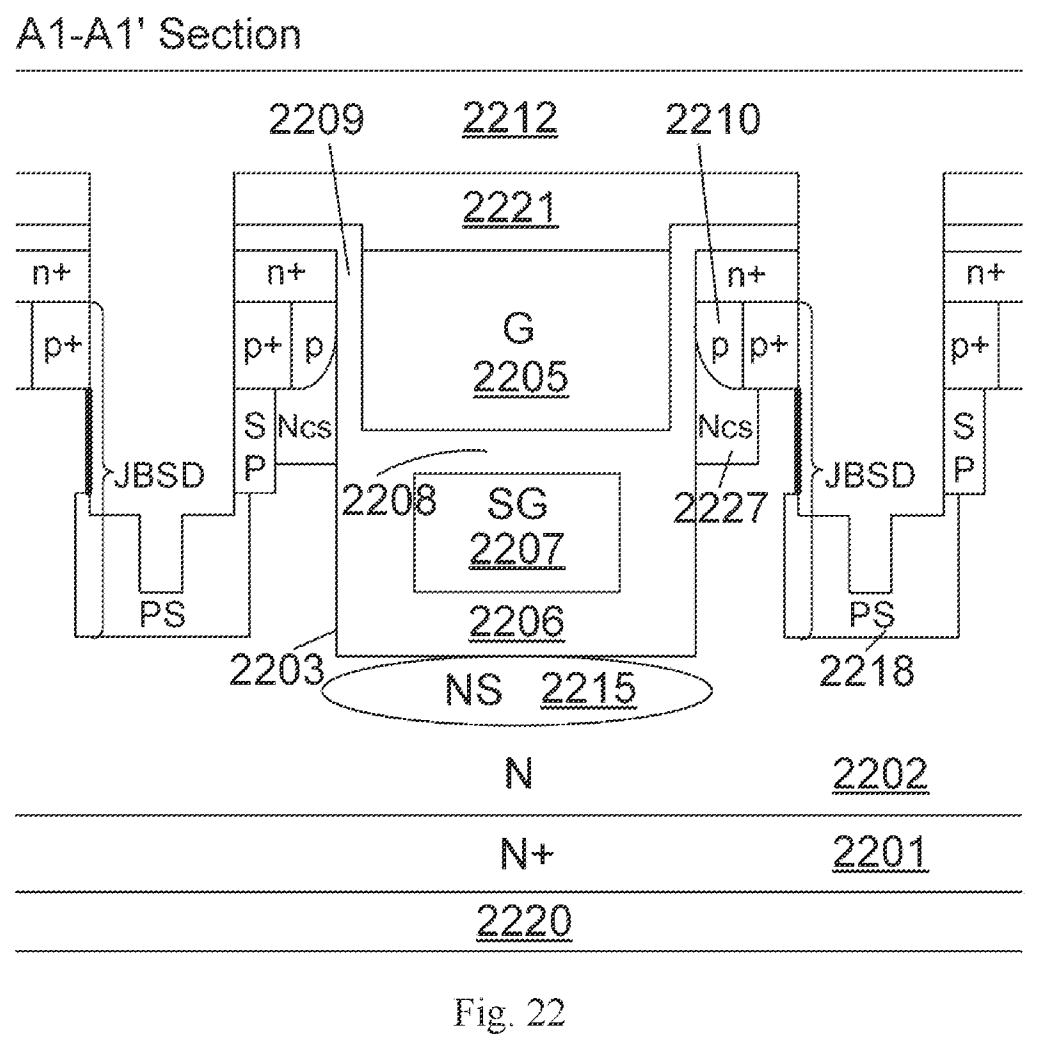

Please refer to FIG. 22 for another preferred A1-A1' cross-sectional view of FIG. 2A. The SiC SGT device has a similar device structure to FIG. 19, except that in the present invention, an N-shield region 2215 (NS, as illustrated) for gate oxide protection is disposed below the gate trench 2203 in the N type epitaxial layer 2202 with a doping concentration higher than that of the N type epitaxial layer 2202. Besides, a current spreading layer 2227 (Ncs, as illustrated) of the first conductivity type is encompassed in an upper portion of the N type epitaxial layer 2202 and below the p body region 2210 and surrounds at least sidewalls of the gate electrode 2205. The Ncs region 2227 is introduced to avoid formation of a pinching off current path between the P-shield region 2218 (PS, as illustrated) and the gate trench 2203, wherein the Ncs region 2227 has a higher doping concentration than that of the N ty pe epitaxial layer 2202 for on-resistance reduction.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A silicon carbide (SiC) power device comprising a plurality of unit cells with each unit cell in an active area comprising:

an epitaxial layer of a first conductivity type on a substrate;

a gate trench formed in said active area surrounded by a source region of said first conductivity type encompassed in a body region of a second conductivity type at a top portion of said epitaxial layer;

a source-body-Schottky contact (SBSC) trench penetrating through said source region and said body region and extending into said epitaxial layer;

a P-shield (PS) region of said second conductivity type for gate oxide electric-field reduction surrounding a bottom of said SBSC trench and being spaced apart from said gate trench;

a body contact region of said second conductivity type disposed in said body region;

a body combination area comprising said body region and body contact region;

a sidewall P (SP) region of said second conductivity type formed selectively along a portion of sidewalls of said SBSC trench, connecting said PS region to said body contact region;

a source metal filling into said SBSC trench to contact with said source region, said body contact region and said PS region; and form a Schottky barrier diode (SBD) region by making a Schottky contact with said epitaxial layer between said body contact region and said buried PS region;

a junction barrier Schottky diode (JBSD) region formed between said source region and a bottom of said PS region, comprising a first PN (P-type/N-type) junction diode, a second PN junction diode and said SBD, wherein said first PN junction diode formed between a body combination area and said epitaxial layer, and a second PN junction diode formed between said buried PS region and said epitaxial layer.

2. The SiC power device of claim 1, wherein a gate electrode disposed in said gate trench surrounded with a first insulating film on a bottom of said gate trench, and with a gate oxide on sidewalls of said gate trench; said first insulating film having a thickness greater than said gate oxide.

3. The SiC power device of claim 2, wherein said SBSC trench has a trench depth deeper than a trench depth of said gate trench.

4. The SiC power device of claim 1, wherein a gate electrode and a shielded gate electrode disposed in said gate trench, said shielded gate electrode insulated from said epitaxial layer by a first insulating film, said gate electrode insulated from said epitaxial layer by a gate oxide, said shielded gate electrode and said gate electrode insulated from each other by an Inter-polysilicon Oxide (IPO) film, said gate oxide having a thickness less than a thickness of said first insulating film.

5. The SiC power device of claim 4, wherein said shielded gate electrode is disposed in a lower portion and said gate electrode is disposed in an upper portion of said gate trench.

6. The SiC power device of claim 4, wherein said shielded gate electrode is disposed in a middle and said gate electrode is a pair of split gate electrodes disposed surrounding an upper portion of said shielded gate electrode.

7. The SiC power device of claim 4, wherein said substrate has said first conductivity type and said epitaxial layer has multiple stepped epitaxial (MSE) layers with different doping concentrations decreasing stepwise in a direction from said substrate to a top surface of said epitaxial layer, wherein each of said MSE layers has a uniform doping concentration as grown.

8. The SiC power device of claim 7, wherein said epitaxial layer comprises at least two stepped epitaxial layers of different doping concentrations including a bottom epitaxial layer with a doping concentration D1 and a top epitaxial layer above said bottom epitaxial layer with a doping concentration D2, wherein said D2<said D1.

9. The SiC power device of claim 4, wherein said epitaxial layer further comprising an oxide charge balance (OCB) region and a buffer region; said OCB region of said first conductivity type formed in a mesa area between two adjacent said gate trenches below said body regions and above a bottom of said shielded gate electrode; said buffer region of said first conductivity in said epitaxial layer formed between said substrate and said OCB region; and said epitaxial layer in said OCB region has MSE layers with different doping concentrations decreasing stepwise in a direction from a bottom of said shielded gate electrode to said body regions along sidewalls of said gate trench, wherein each of said MSE layers has a uniform doping concentration as grown; and said epitaxial layer in said buffer region has a doping concentration lower than doping concentrations of said MSE layers in said OCB region.

10. The SiC power device of claim 1, wherein said SP region is formed along a first sidewall of said SBSC trench and said SBD is formed along a second sidewall opposite to said first sidewall of said SBSC trench.

11. The SiC power device of claim 1, wherein said SP and SBD regions are alternately formed along two sidewalls of said SBSC trench.

12. The SiC power device of claim 1, further comprising a current spreading region of said first conductivity type surrounding upper portions of sidewalls of said gate trench, wherein said current spreading layer has a doping concentration higher than a doping concentration of said epitaxial layer.

13. The SiC power device of claim 1, further comprising at least one N-shield (NS) region of said first conductivity type disposed at a position deeper than said gate trench in said epitaxial layer with a doping concentration higher than a doping concentration of said epitaxial layer.

14. The SiC power device of claim 1, further comprising a second PS region of said second conductivity type surrounding a sidewall of said gate trench on an opposite side of said JBSD region and adjoining said body region, and extending further along a portion of a bottom of said gate trench.

15. The SiC power device of claim 1, wherein said substrate has said first conductivity type and epitaxial layer is a single epitaxial layer with a uniform doping concentration.

16. The SiC power device of claim 1, wherein said substrate has said second conductivity type, further comprising a buffer layer of said first conductivity type with a resistivity Rb sandwiched between said substrate and said epitaxial layer having a uniform doping concentration with a resistivity R, wherein said R>said Rb.

17. The SiC power device of claim 1, wherein said substrate has said second conductivity type, further comprising a buffer layer of said first conductivity type with a resistivity Rb sandwiched between said substrate and said epitaxial layer with a resistivity R, wherein said R>said Rb, and a plurality of heavily doped regions of said first conductivity type in said substrate to form a plurality of alternating P+ and N+ regions in said substrate.

18. The SiC power device of claim 1, wherein said PS region has a doping concentration higher than a doping concentration of said SP region.

19. The SiC device of claim 1, wherein said source metal has multiple metal films comprising a Nickel as a first metal film, a Titanium as a second metal film, an Aluminum as a third metal film and a Tungsten as a fourth metal film.

20. The SiC device of claim 1, wherein said SBSC trench having a first type SBSC trench and a second type SBSC trench; said first type SBSC trench is formed above said second type SBSC trench and has a trench width wider than a trench width of said second type gate trench; said PS region surrounding sidewalls and a bottom of said second SBSC trench.

\* \* \* \* \*